(12) United States Patent
Sakurada et al.

(10) Patent No.: US 10,566,049 B2
(45) Date of Patent: Feb. 18, 2020

(54) SEMICONDUCTOR MEMORY DEVICE

(71) Applicant: Toshiba Memory Corporation, Minato-ku (JP)

(72) Inventors: Kenji Sakurada, Yamato (JP); Masanobu Shirakawa, Chigasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/896,365

(22) Filed: Feb. 14, 2018

(65) Prior Publication Data

US 2019/0080747 A1  Mar. 14, 2019

(30) Foreign Application Priority Data

Sep. 14, 2017  (JP) ................. 2017-176677

(51) Int. Cl.
| | | |
|---|---|---|
| G11C 16/24 | (2006.01) | |
| G11C 11/419 | (2006.01) | |
| G11C 16/34 | (2006.01) | |
| G11C 7/06 | (2006.01) | |
| G11C 16/32 | (2006.01) | |
| G11C 16/26 | (2006.01) | |
| G11C 11/56 | (2006.01) | |
| G11C 16/08 | (2006.01) | |
| G11C 16/04 | (2006.01) | |

(52) U.S. Cl.
CPC .............. *G11C 11/419* (2013.01); *G11C 7/06* (2013.01); *G11C 11/5642* (2013.01); *G11C 16/08* (2013.01); *G11C 16/24* (2013.01); *G11C 16/26* (2013.01); *G11C 16/32* (2013.01); *G11C 16/34* (2013.01); *G11C 16/0483* (2013.01)

(58) Field of Classification Search
CPC ... G11C 11/419; G11C 16/08; G11C 16/0483; G11C 16/24; G11C 16/26
See application file for complete search history.

(56) References Cited

U.S. PATENT DOCUMENTS

| | | |
|---|---|---|
| 8,250,437 B2 | 8/2012 | Sakurada et al. |
| 8,406,048 B2 | 3/2013 | Yang et al. |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2010/0223538 A1 | 9/2010 | Sakurada |
| 2011/0167305 A1 | 7/2011 | Haratsch et al. |

(Continued)

FOREIGN PATENT DOCUMENTS

| | | |
|---|---|---|
| JP | 4818381 | 11/2011 |
| JP | 5519209 | 6/2014 |
| JP | 5535219 | 7/2014 |

*Primary Examiner* — Hoai V Ho
*Assistant Examiner* — Jay W. Radke
(74) *Attorney, Agent, or Firm* — Oblon, McClelland, Maier & Neustadt, L.L.P.

(57) ABSTRACT

According to one embodiment, a semiconductor memory device includes: a first memory cell; a first latch circuit; and a second latch circuit. The first latch circuit and the second latch circuit are associated with the first memory cell. When the semiconductor memory device receives, from an external device, a first address designating one of the first latch circuit and the second latch circuit and a read command for data of the first memory cell, data is read from the first memory cell and the read data is held in the one of the first latch circuit and the second latch circuit corresponding to the first address.

20 Claims, 31 Drawing Sheets

(56) References Cited

U.S. PATENT DOCUMENTS

| | | |
|---|---|---|
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2017/0263312 A1 | 9/2017 | Sakurada et al. |

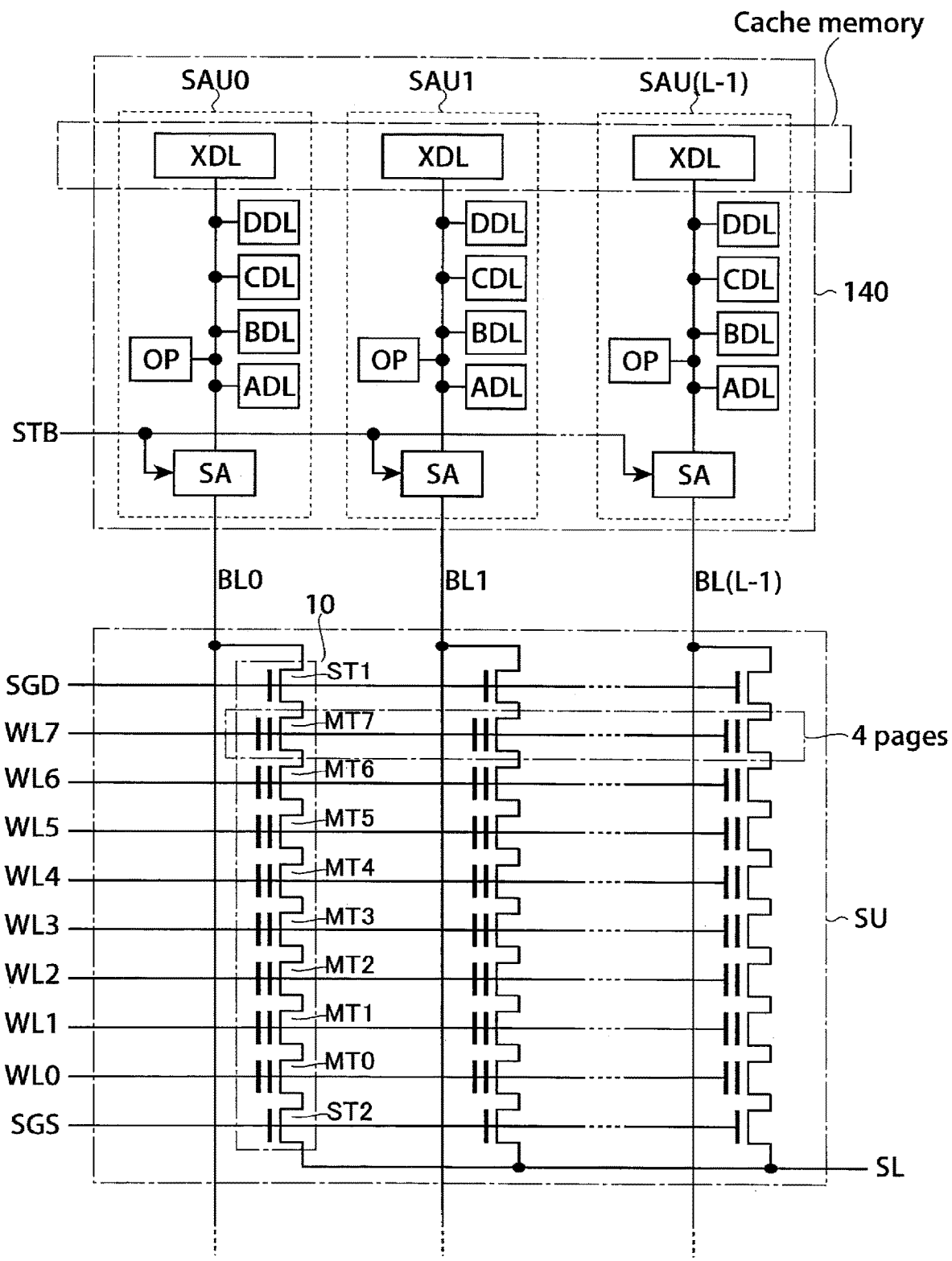
F I G. 4

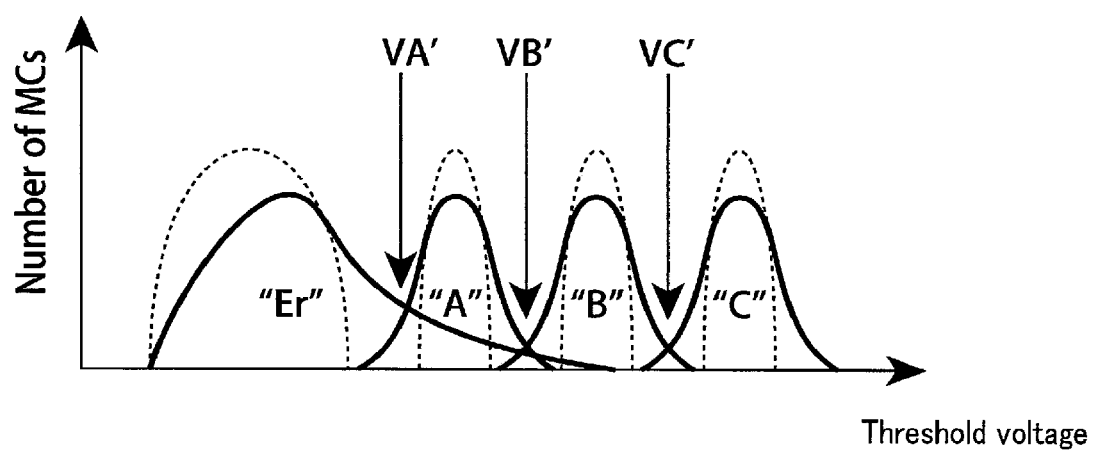
F I G. 7

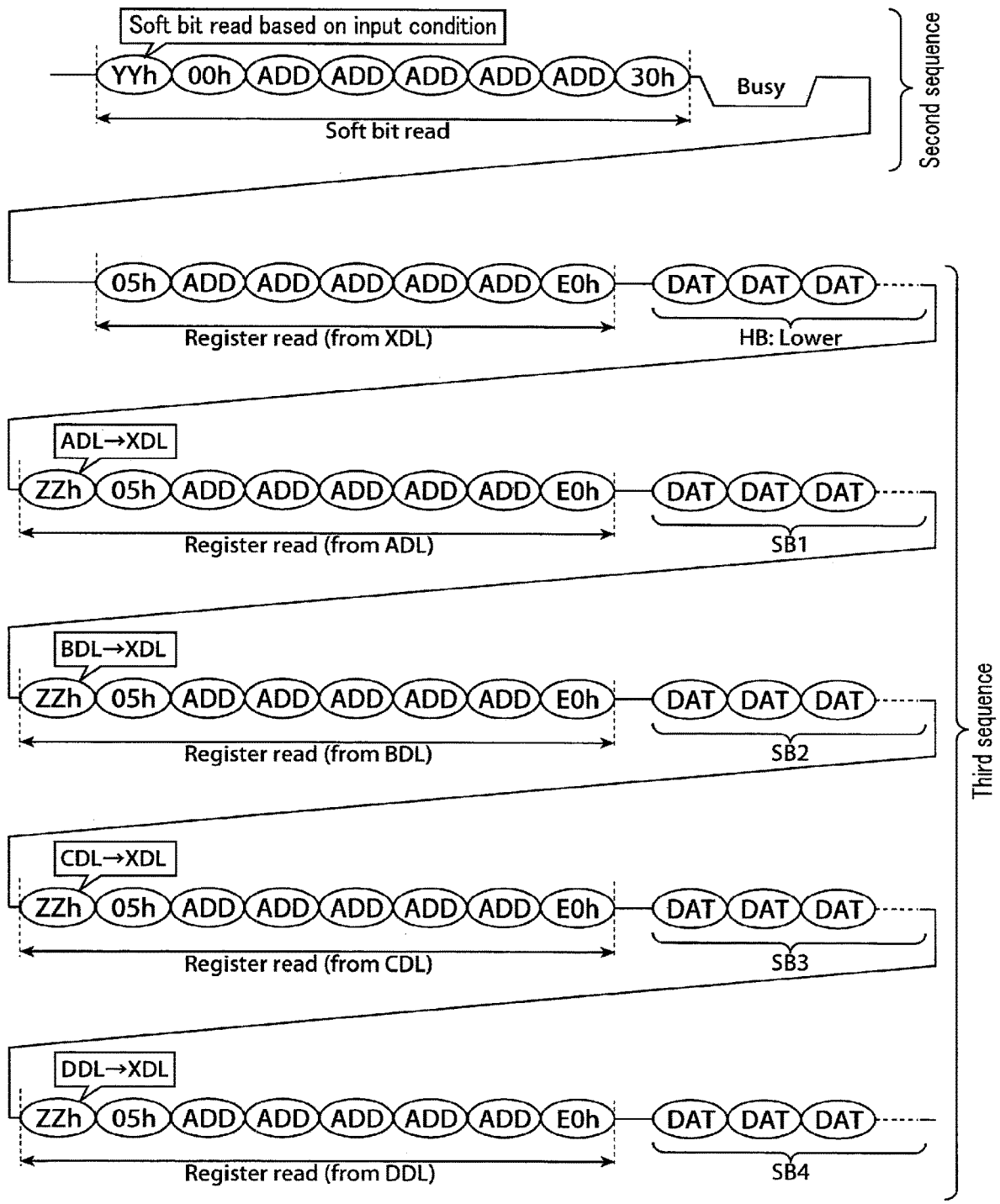
F I G. 10

| Command register | Number-of-times register | Voltage designation register | | Latch designation register | Sequencer or latch circuit |
|---|---|---|---|---|---|
| AR | 7 | AR1 | $-3\Delta$ | ADL | ~SA |
| | | AR2 | $-2\Delta$ | BDL | ~SA |
| | | AR3 | $-\Delta$ | ADL | SA xor ADL |
| | | AR4 | 0 | XDL | ~SA |
| | | AR5 | $+\Delta$ | ADL | SA xor ADL |
| | | AR6 | $+2\Delta$ | BDL | SA xor BDL |
| | | AR7 | $+3\Delta$ | ADL | SA xor ADL |
| DR | 7 | DR1 | $-3\Delta$ | DDL | ~SA |
| | | DR2 | $-2\Delta$ | CDL | ~SA |
| | | DR3 | $-\Delta$ | DDL | SA xor DDL |
| | | DR4 | 0 | XDL | SA xor XDL |
| | | DR5 | $+\Delta$ | ADL | SA xor ADL |
| | | DR6 | $+2\Delta$ | BDL | SA xor BDL |
| | | DR7 | $+3\Delta$ | ADL | SA xor ADL |
| ⋮ | ⋮ | ⋮ | ⋮ | ⋮ | ⋮ |

F I G. 11

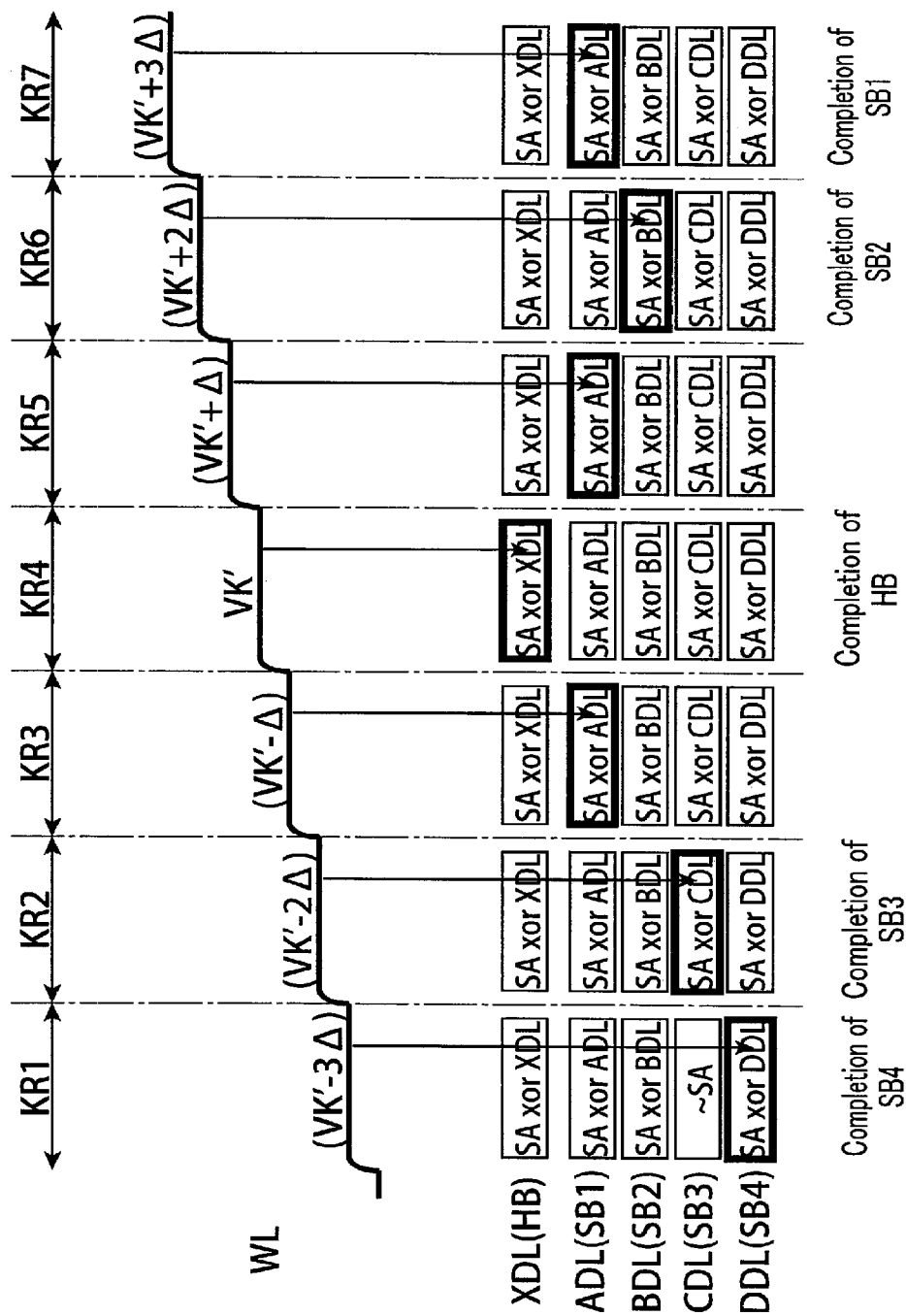
F I G. 16

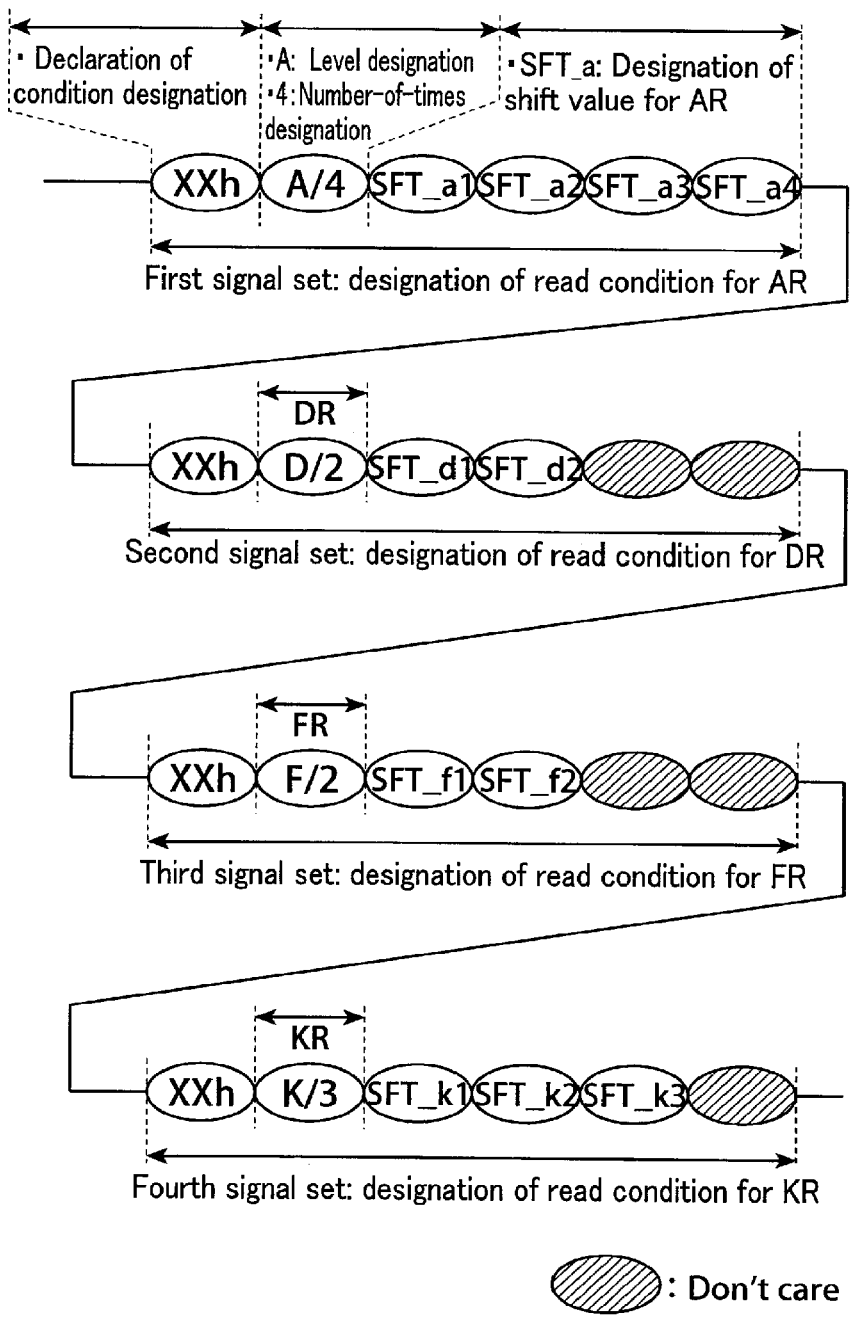
F I G. 20

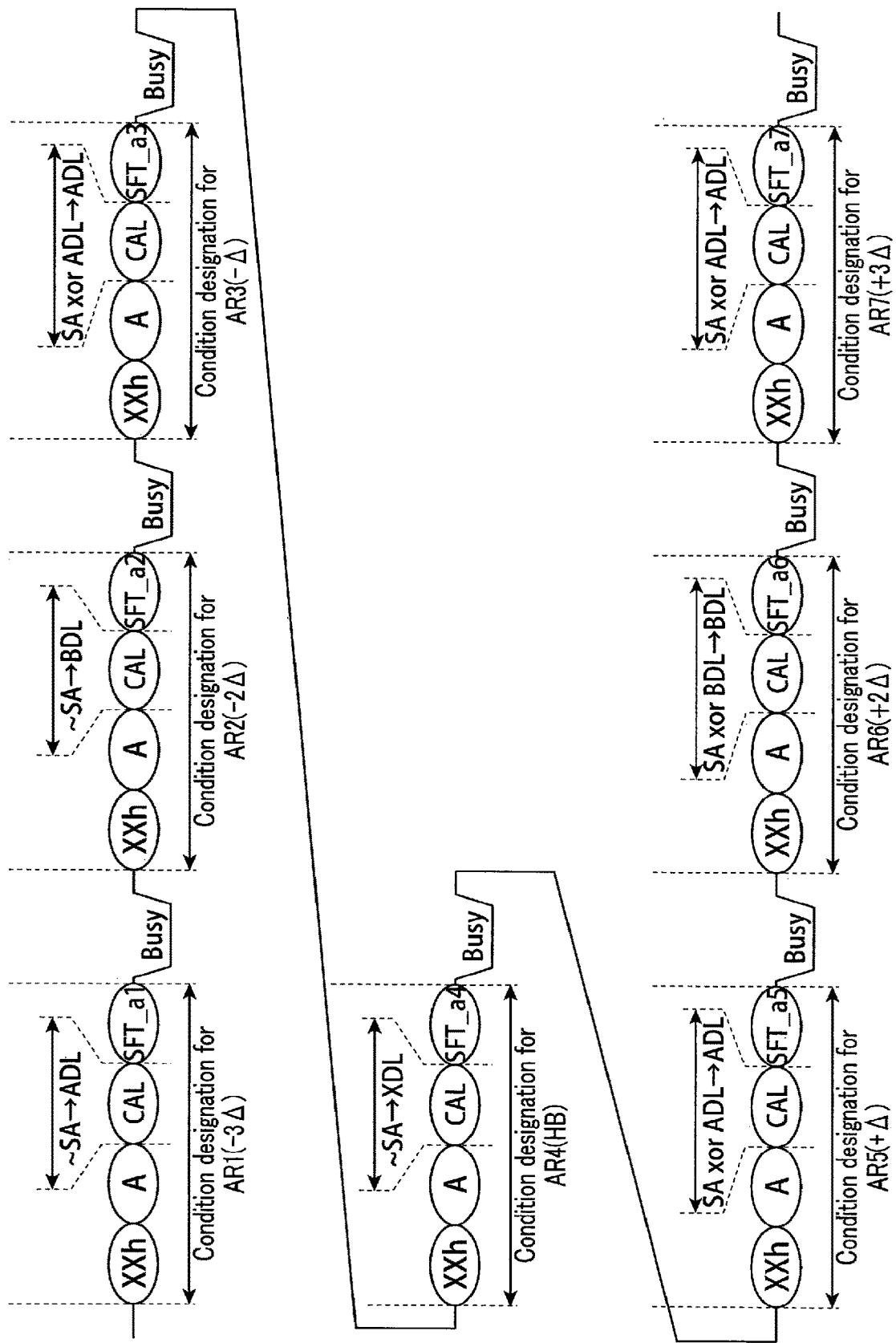
F I G. 22

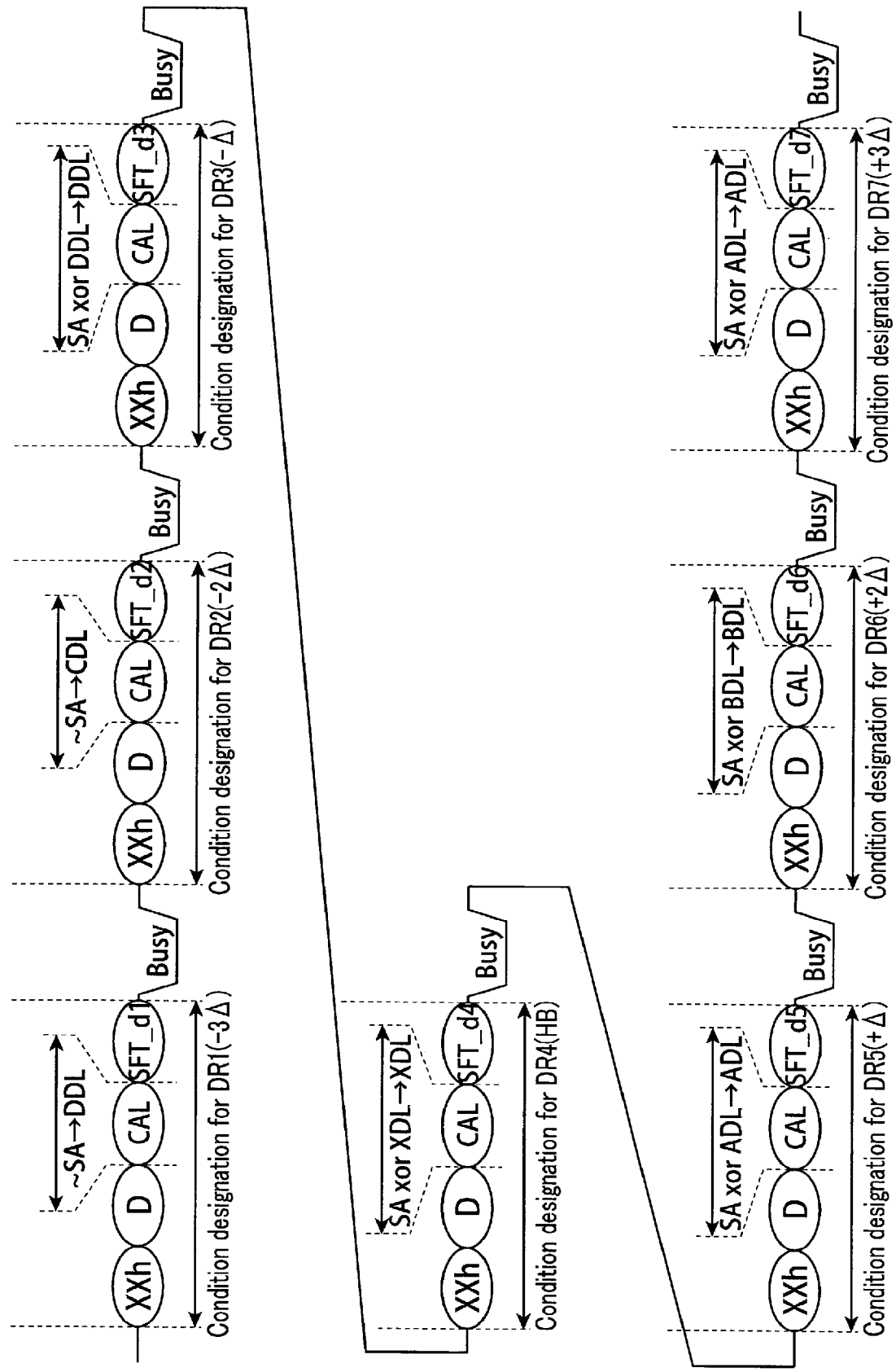
F I G. 23

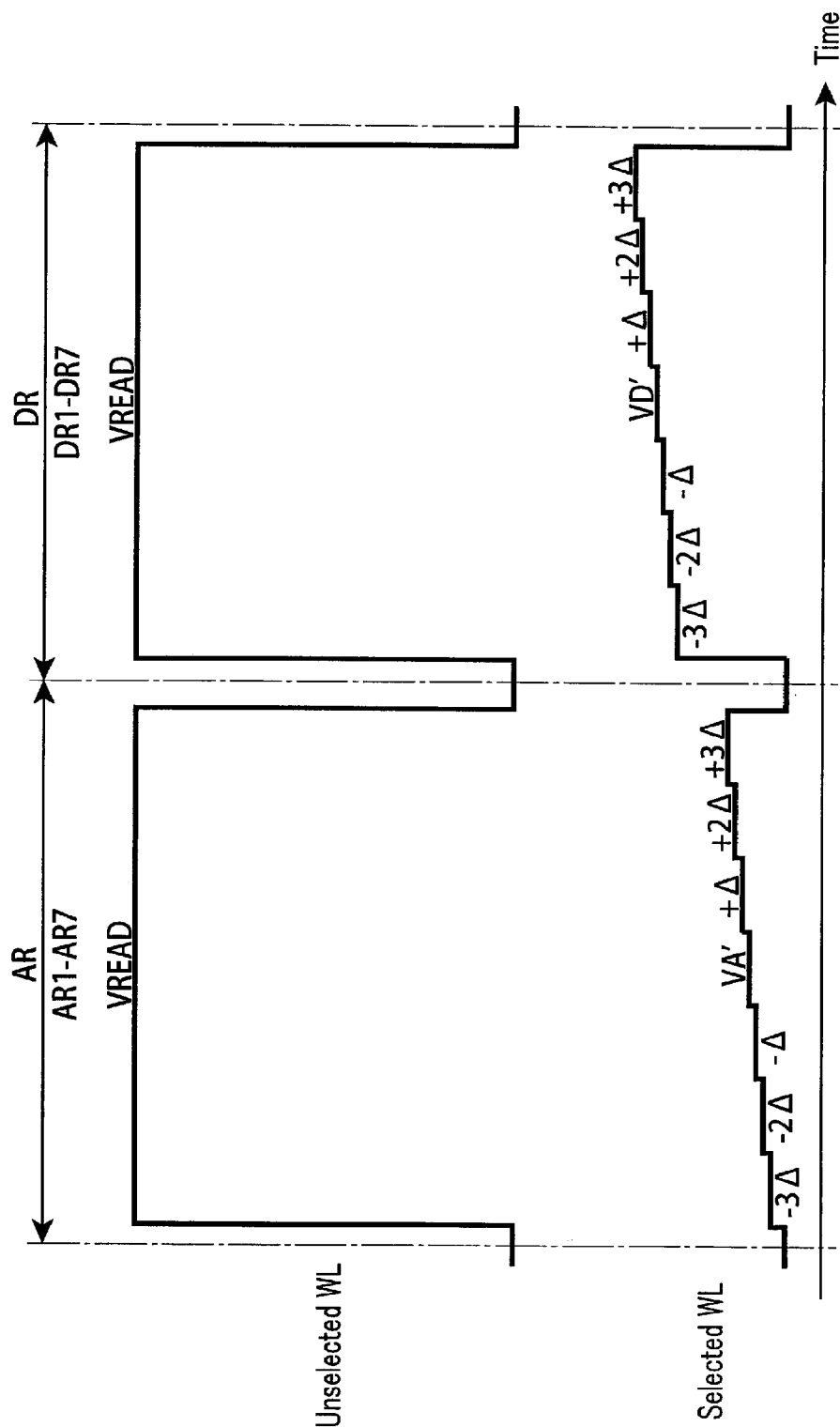
F I G. 27

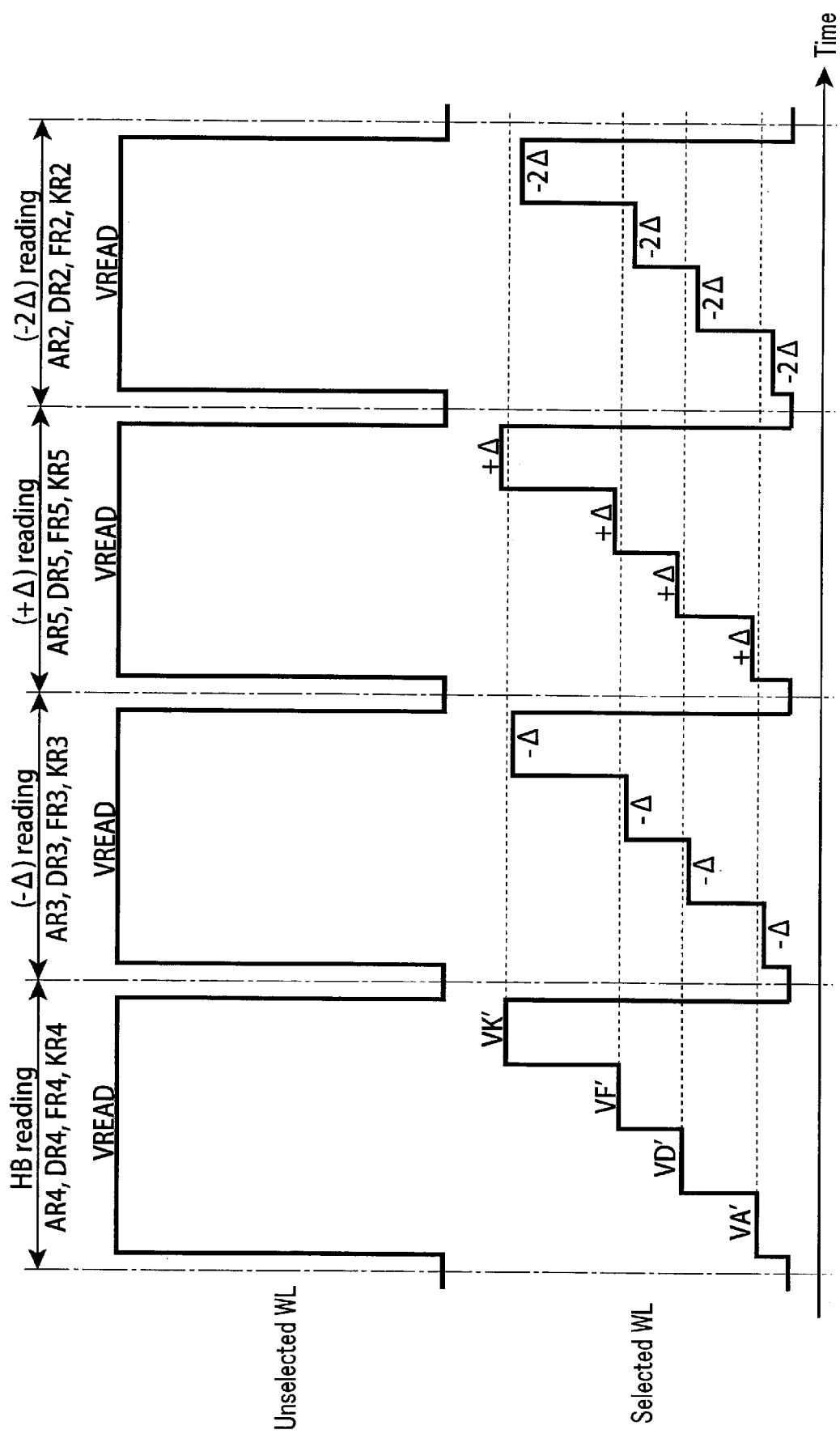
F I G. 29

SEMICONDUCTOR MEMORY DEVICE

CROSS-REFERENCE TO RELATED APPLICATIONS

This application is based upon and claims the benefit of priority from Japanese Patent Application No. 2017-176677, filed Sep. 14, 2017, the entire contents of which are incorporated herein by reference.

FIELD

Embodiments described herein relate generally to a semiconductor memory device.

BACKGROUND

A semiconductor memory in which memory cells are three dimensionally arranged is known.

BRIEF DESCRIPTION OF THE DRAWINGS

FIG. 4 is a circuit diagram illustrating a memory cell array and a sense amplifier according to the first embodiment;

FIG. 7 is a graph illustrating threshold distributions of memory cells;

FIG. 9 and FIG. 10 illustrate command sequences used when a soft bit read is performed according to the first embodiment;

FIG. 11 is a conceptual diagram showing various registers according to the first embodiment;

FIGS. 13, 14, 15 and FIG. 16 are schematic diagrams showing how a word line voltage and the data in latch circuits change with time when a soft bit read is performed according to the first embodiment;

FIGS. 19, 20, 21, 22, 23, 24 and FIG. 25 illustrate command sequences used when a soft bit read is performed according to the fifth embodiment;

FIG. 27 and FIG. 28 are timing charts showing how a word line voltage changes with time when a soft bit read is performed according to the first modification of each of the first through sixth embodiments;

FIG. 29 and FIG. 30 are timing charts showing how a word line voltage changes with time when a soft bit read is performed according to the second modification of each of the first through sixth embodiments.

DETAILED DESCRIPTION

In general, according to one embodiment, a semiconductor memory device includes: a first memory cell; a first latch circuit; and a second latch circuit. The first memory cell is capable of storing data. The first latch circuit is associated with the first memory cell. The second latch circuit is associated with the first memory cell. When the semiconductor memory device receives, from an external device, a first address designating one of the first latch circuit and the second latch circuit and a read command for reading data of the first memory cell, data is read from the first memory cell and the read data is held in the one of the first latch circuit and the second latch circuit corresponding to the first address.

1. First Embodiment

A semiconductor memory device according to the first embodiment will be described. In the description below, reference will be made to the case where the semiconductor memory device is realized as a memory system including a NAND flash memory.

1.1 Configuration

1.1.1 Overall Configuration of Memory System

First, the general overall configuration of a memory system according to the present embodiment will be described with reference to FIG. 1.

Figure 1:
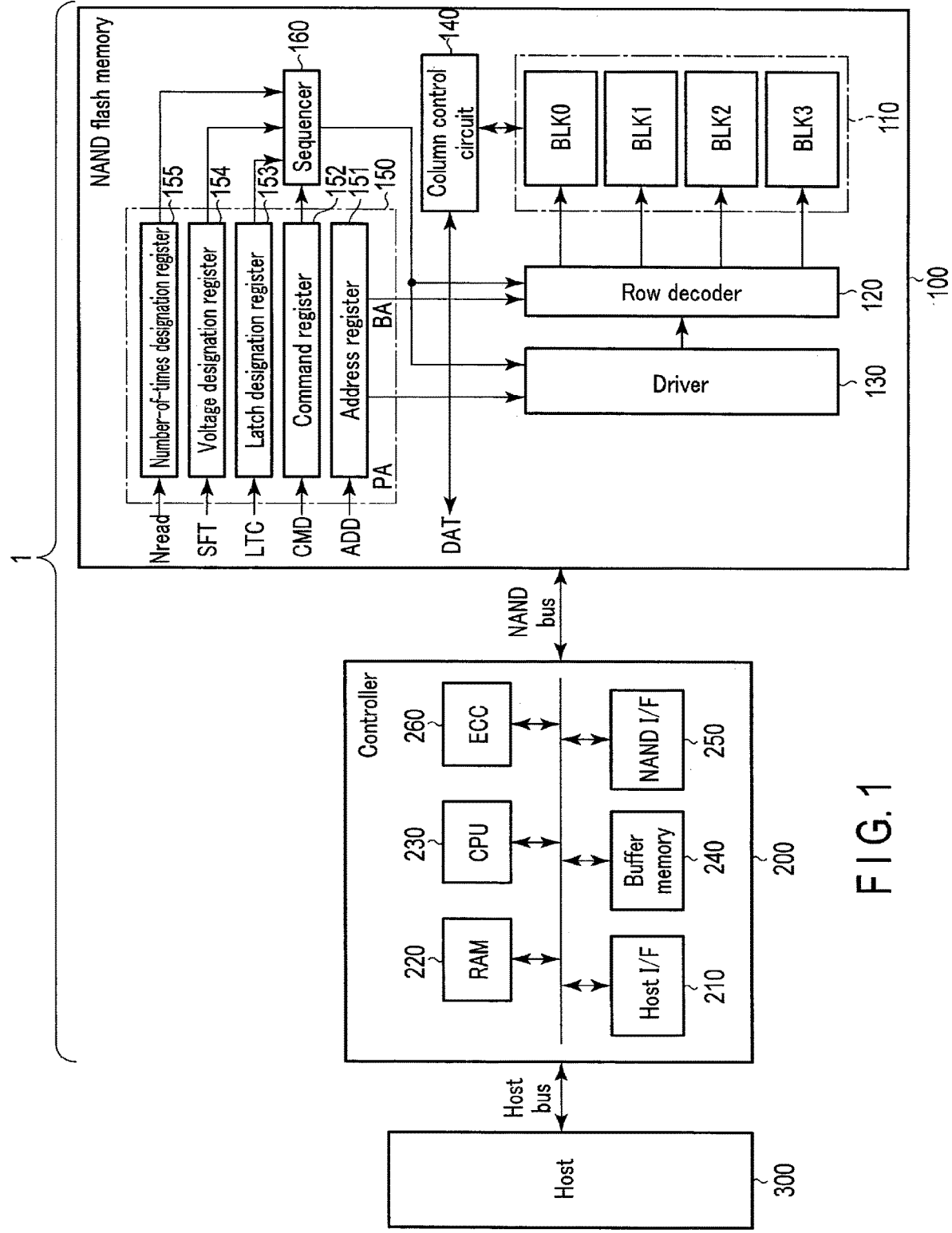
FIG. 1 is a block diagram showing a memory system according to the first embodiment.

As shown in FIG. 1, the memory system 1 comprises a NAND flash memory 100 and a controller 200. The NAND flash memory 100 and the controller 200 may constitute one semiconductor device, for example, by combining them together. Examples of such a semiconductor device are a memory card, such as an SD™ card, and a solid-state drive (SSD). The controller 200 may be a system on chip (SoC), for example.

The NAND flash memory 100 includes a plurality of memory cells and stores data in a nonvolatile manner. The controller 200 is connected to the NAND flash memory 100 via a NAND bus, and is connected to a host device 300 via a host bus. The controller 200 controls the NAND flash memory 100 and accesses the NAND flash memory 100 in response to an instruction received from the host device 300. The host device 300 is, for example, a digital camera, a personal computer or the like, and the host bus is, for example, a bus compatible with the SD™ interface. The NAND bus is a bus through which signals compatible with the NAND interface are transmitted and received.

1.1.2 Configuration of Controller 200

A detailed configuration of the controller 200 will be described with reference to FIG. 1. As shown in FIG. 1, the controller 200 includes a host interface circuit 210, an internal memory (RAM) 220, a processor (CPU) 230, a buffer memory 240, a NAND interface circuit 250, and an Error Checking and Correcting (ECC) circuit 260.

The host interface circuit 210 is connected to the host device 300 via the host bus, and transfers instructions and data received from the host device 300 to the processor 230 and the buffer memory 240. The host interface circuit 210 also transfers data in the buffer memory 240 to the host device 300 in response to instructions from the processor 230.

The processor 230 controls the entire operation of the controller 200. For example, if a write instruction is received from the host device 300, the processor 230 issues a write instruction to the NAND interface circuit 250 in response to the received instruction. Similar operations are performed in read and erase operations as well. The processor 230 also executes various kinds of processes such as wear leveling to manage the NAND flash memory 100. The operations of the controller 200 described below may be realized by firmware (CPU) or by hardware.

The NAND interface circuit 250 is connected to the NAND flash memory 100 via the NAND bus, and performs communications with the NAND flash memory 100. Based on instructions received from the processor 230, the NAND interface circuit 250 transmits various signals to the NAND flash memory 100 and receives various signals from the NAND flash memory 100.

The buffer memory 240 temporarily holds write data or read data.

The internal memory 220 is, for example, a semiconductor memory such as a DRAM or an SRAM, and is used as the workspace of the processor 230. The internal memory 220 holds firmware for managing the NAND flash memory 100 and various kinds of management tables.

The ECC circuit 260 performs error detection and error correction processes for data stored in the NAND flash memory 100. That is, at the time of data writing, the ECC circuit 260 generates an error correcting code and adds it to the write data. At the time of data reading, the ECC circuit 260 decodes the read data.

1.1.3 Configuration of NAND Flash Memory 100

1.1.3.1 Overall Configuration of NAND Flash Memory 100

Next, a description will be given of the configuration of the NAND flash memory 100. As shown in FIG. 1, the NAND flash memory 100 includes a memory cell array 110, a row decoder 120, a driver circuit 130, a column control circuit 140, a register group 150 and a sequencer 160.

The memory cell array 110 includes a plurality of blocks BLK each including a plurality of nonvolatile memory cells associated with rows and columns. FIG. 1 shows four blocks BLK0 through BLK3 by way of example. The memory cell array 110 stores data provided by the controller 200.

The row decoder 120 selects one of the blocks BLK0 through BLK3, and further selects a row direction in the selected block BLK.

The driver circuit 130 applies voltages to the selected block BLK via the row decoder 120.

At the time of data reading, the column control circuit 140 senses data read from the memory cell array 110 and performs necessary operations. The column control circuit 140 outputs data DAT to the controller 200. At the time of data writing, the column control circuit 140 transfers the write data DAT received from the controller 200 to the memory cell array 110.

The register group 150 includes, for example, five registers 151 to 155. An address register 151 holds an address ADD received from the controller 200. A command register 152 holds a command CMD received from the controller 200. A latch designation register 153 holds latch designation information LTC received from the controller 200. The latch designation information LTC is information for designating which latch circuit of the column control circuit 140 should hold data read from the memory cell array 110. Details of the latch designation information LTC will be described later. A voltage designation register 154 holds shift information SFT received from the controller 200. The shift information SFT is information for designating a shift amount used when data is repeatedly read from the memory cell array 110, with the read voltage applied to the word line being shifted. A number-of-times designation register 155 holds number-of-times information Nread received from the controller 200. The number-of-times Nread is information for designating the number of times data is repeatedly read from the memory cell array, wherein the read voltage applied to the word line is shifted each time after the first time.

The sequencer 160 controls the entire operation of the NAND flash memory 100 based on various information held in the register group 150.

1.1.3.2 Configuration of Block BLK

Figure 2:
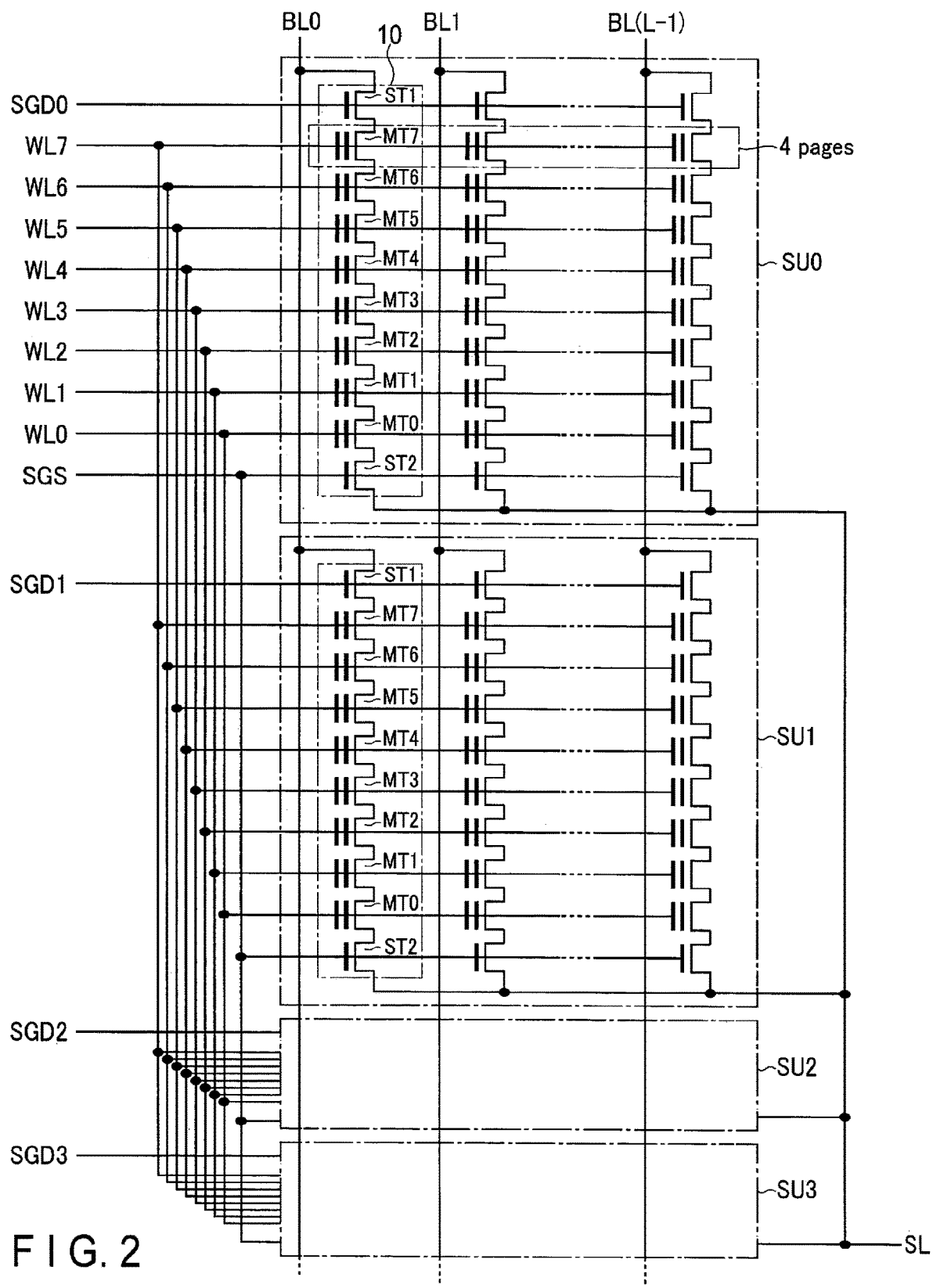
FIG. 2 and FIG. 3 are a circuit diagram and a sectional view illustrating a block according to the first embodiment.

The configuration of block BLK will be described with reference to FIG. 2. As shown in FIG. 2, block BLK includes, for example, four string units SU (SU0 through SU3). Each string unit SU includes a plurality of NAND strings 10.

Each NAND string 10 includes, for example, eight memory cell transistors MT (MT0 through MT7) and select transistors ST1 and ST2. Each of the memory cell transistors MT includes a control gate and a charge accumulation layer, and holds data in a nonvolatile manner. The memory cell transistors MT are connected in series between the source of select transistor ST1 and the drain of select transistor ST2.

The gates of select transistors ST1 of the string units SU0 through SU3 are connected to select gate lines SGD0 through SGD3, respectively. On the other hand, the gates of select transistors ST2 of the string units SU0 through SU3 are commonly connected, for example, to a select gate line SGS. Needless to say, the gates of select transistors ST2 may be connected to different select gate lines SGS0 through SGS3 of the respective string units. The control gates of the memory cell transistors MT0 through MT7 of the same block BLK are commonly connected to word lines WL0 through WL7, respectively.

The drains of select transistors ST1 of the NAND strings 10 of the same column in the memory cell array 110 are commonly connected to a bit line BL (one of BL0 through BL(L-1), where (L-1) is a natural number of 2 or more). That is, the bit lines BL commonly connect the NAND strings 10 across the plurality of blocks BLK. The sources of the select transistors ST2 are commonly connected to a source line SL.

That is, the string unit SU includes a plurality of NAND strings 10 connected to different bit lines BL and connected to the same select gate line SGD. The block BLK includes a plurality of string units SU that share the word lines WL. The memory cell array 110 includes a plurality of blocks BLK that share the bit lines BL.

Figure 3:
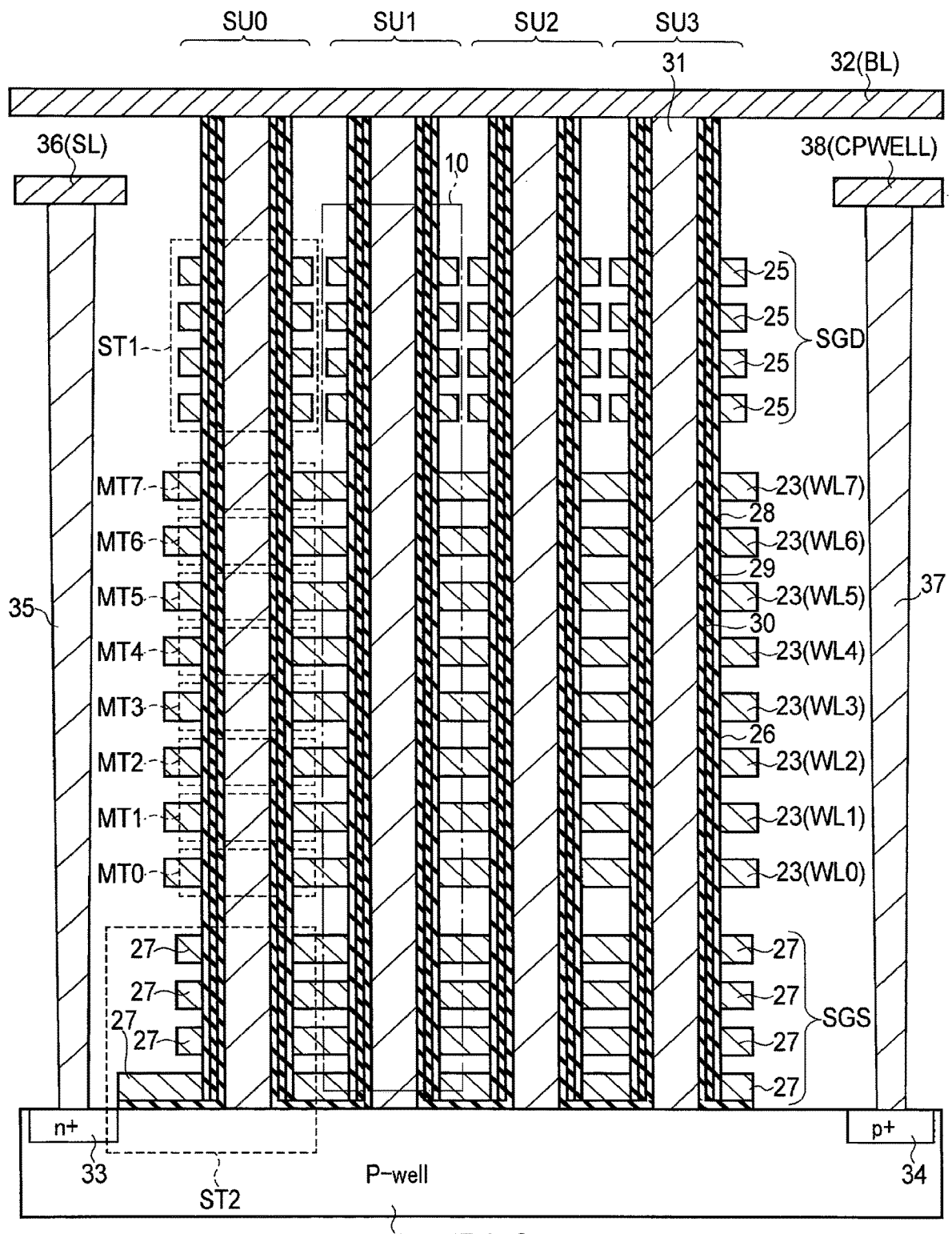

FIG. 3 is a sectional view of a partial region of the block BLK. As shown in FIG. 3, a plurality of NAND strings 10 are formed on a p type well region 20. That is, for example, four interconnect layers 27 functioning as the select gate lines SGS, eight interconnect layers 23 functioning as the word lines WL0 through WL7, and, for example, four interconnect layers 25 functioning as the select gate lines SGD are stacked over the well region 20 in order. Insulating films (not shown) are formed between the stacked interconnect layers.

Pillar-shaped conductors 31 extending through the interconnect layers 25, 23 and 27 and reaching the well region 20 are formed. Gate insulating films 30, charge accumulation layers (insulating films) 29 and block insulating films 28 are formed in order on the side surfaces of the conductors 31. By these films and layers, the memory cell transistors MT and the select transistors ST1 and ST2 are formed. Each conductor 31 is a region which functions as a current path of the NAND string 10 and in which the channels of the transistors are formed. The upper ends of the conductors 31 are connected to a metal interconnect layer 32 functioning as the bit line. BL.

An n+ type impurity diffusion layer 33 is formed in a surface region of the well region 20. A contact plug 35 is formed on the diffusion layer 33. The contact plug 35 is connected to a metal interconnect layer 36 functioning as the source line SL. In addition, a p+ type impurity diffusion layer 34 is formed in a surface region of the well region 20. A contact plug 37 is formed on the diffusion layer 34. The contact plug 37 is connected to a metal interconnect layer 38 functioning as a well interconnect CPWELL. The well interconnect CPWELL is an interconnect used to apply a potential to the conductors 31 via the well region 20.

A plurality of configurations described above are arranged in the depth direction of the drawing sheet of FIG. 3. Each string unit SU is formed as a group of NAND strings 10, each of the NAND strings 10 having memory cell transistors arranged in the depth direction.

In this example, one memory cell transistor MT may hold, for example, 4-bit data. The bits of the 4-bit data will be referred to as a lower bit, an upper bit, a higher bit and a top bit, from the low-order bit. A group of lower bits held in the memory cells connected to the same word line in the same selected string unit SU will be referred to as a lower page, a group of upper bits held in such memory cells will be referred to as an upper page, a group of higher bits held in such memory cells will be referred to as a higher page, and a group of top bits held in such memory cells will be referred to as a top page. That is, four pages are assigned to one word line WL, and the string unit SU including eight word lines WL has a capacity of 32 pages. Since one block BLK includes four string units SU, each block BLK has a capacity of 128 pages. In other words, "page" may be defined as part of a memory space formed by memory cells connected to the same word line. Writing and reading of data are performed in units of this page.

Note that the erasing of data may be performed in units of one block BLK or in a unit smaller than the block BLK. An erasing method is described, for example, in U.S. patent application Ser. No. 13/235,389 titled "NONVOLATILE SEMICONDUCTOR MEMORY DEVICE" and filed on Sep. 18, 2011. An erasing method is also described, for example, in U.S. patent application Ser. No. 12/694,690 titled "NON-VOLATILE SEMICONDUCTOR STORAGE DEVICE" and filed on Jan. 27, 2010. An erasing method is further described, for example, in U.S. patent application Ser. No. 13/483,610 titled "NONVOLATILE SEMICONDUCTOR MEMORY DEVICE AND DATA ERASE METHOD THEREOF" and filed on May 30, 2012. The entire contents of these applications are incorporated herein by reference.

The memory cell array 110 may have another configuration. That is, a configuration of the memory cell array 110 is described, for example, in U.S. patent application Ser. No. 12/407,403 titled "THREE DIMENSIONAL STACKED NONVOLATILE SEMICONDUCTOR MEMORY" and filed on Mar. 19, 2009. Configurations are also described in U.S. patent application Ser. No. 12/406,524 titled "THREE DIMENSIONAL STACKED NONVOLATILE SEMICONDUCTOR MEMORY" and filed on Mar. 18, 2009, U.S. patent application Ser. No. 12/679,991 titled "NON-VOLATILE SEMICONDUCTOR STORAGE DEVICE AND METHOD OF MANUFACTURING THE SAME" and filed on Mar. 25, 2010, and U.S. patent application Ser. No. 12/532,030 titled "SEMICONDUCTOR MEMORY AND METHOD FOR MANUFACTURING SAME" and filed on Mar. 23, 2009. The entire contents of these applications are incorporated herein by reference.

1.1.3.3 Configuration of Column Control Circuit 140

A configuration of the column control circuit 140 will be described with reference to FIG. 4. FIG. 4 is a circuit diagram illustrating the column control circuit 140 and string unit SU according to the first embodiment.

As depicted in FIG. 4, the column control circuit 140 includes sense units SAU (SAU0 through SAU(L-1)) provided for the respective bit lines BL.

Each of the sense units SAU includes a sense amplifier SA, an arithmetic module OP, and latch circuits ADL, BDL, CDL, DDL and XDL.

The sense amplifier SA senses data read onto the corresponding bit line BL, and applies a voltage to the bit line BL in accordance with write data. That is, the sense amplifier SA is a module that directly controls the bit line BL. At the time of reading, strobe signal STB is supplied to the sense amplifier SA, for example, from a sequencer 170. The sense amplifier SA finally determines read data when signal STB is asserted (in this example, the read data is defined as data "0" when the memory cell is turned on, and is as data "1" when the memory cell is turned off.) The data is held in an internal latch circuit (not shown in FIG. 4), and is transferred to one of latch circuits ADL, BDL, CDL, DDL and XDL.

Latch circuits ADL, BDL, CDL, DDL and XDL temporarily hold read data and write data. The arithmetic module OP performs various arithmetic operations, such as a not (NOT) operation, a logical add (OR) operation, a logical multiply (AND) operation, and an exclusive logical add (XOR) operation, on data held in the sense amplifier SA and latch circuits ADL, BDL, CDL, DDL and XDL.

The sense amplifier SA, latch circuits ADL, BDL, CDL, DDL and XDL, and the arithmetic module OP are connected together by a bus such that data can be transmitted and received to and from each other. The bus is connected further to latch circuit XDL.

Data is input to and output from the column control circuit 140 via latch circuit XDL. That is, data received from the controller 200 is transferred to latch circuits ADL, BDL, CDL and DDL or the sense amplifier SA via latch circuit XDL. Furthermore, data from latch circuits ADL, BDL, CDL and DDL or the sense amplifier SA is transmitted to the controller 200 via latch circuit XDL. Latch circuit XDL functions as a cache memory for the NAND flash memory 100. Therefore, even when latch circuits ADL, BDL, CDL and DDL are in use, the NAND flash memory 100 can be set in the ready state as long as latch circuit XDL is idle.

1.1.3.4 Held Data in Memory Cell Transistor and Threshold Voltage

Figure 5:
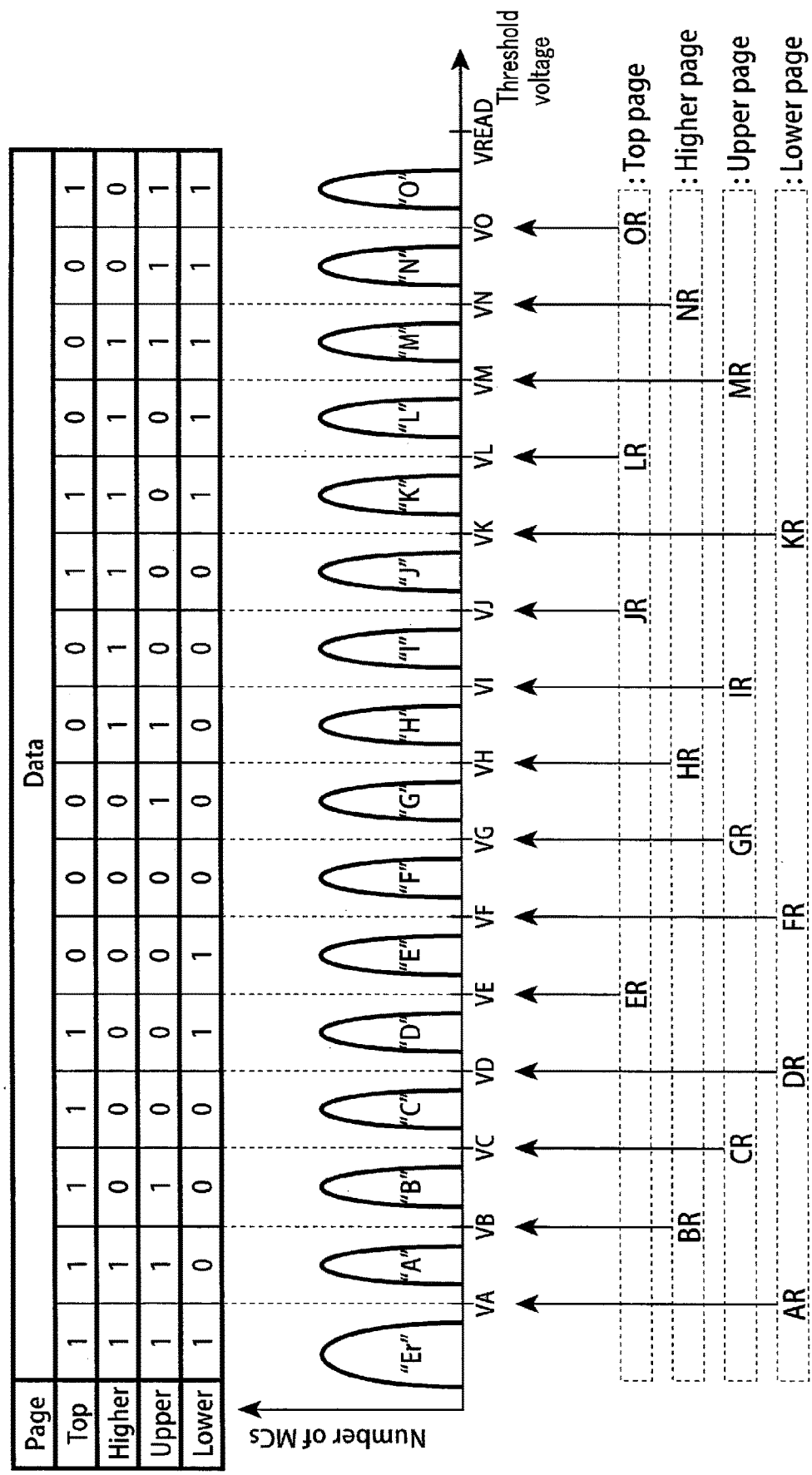
FIG. 5 shows a graph illustrating threshold distributions of memory cells according to the first embodiment and a conceptual diagram illustrating relationships between pages and read operations.

The data held in memory cell transistor MT, a threshold voltage, and a read level of each data will be described with reference to FIG. 5. FIG. 5 is a diagram illustrating data that can be held in each memory cell transistor MT, threshold distributions and voltages that are used at the time of reading.

As described above, memory cell transistor MT can hold 4-bit data in accordance with a threshold voltage. Data expressed by the 4 bits will be referred to as "Er" data, "A" data, "B" data, "C" data . . . , and "O" data in the ascending order of threshold voltage.

The threshold voltage of the memory cell transistor MT holding "Er" data is lower than voltage VA and corresponds to a data erase state. The threshold voltage of the memory cell transistor MT holding "A" data is equal to VA or higher and is lower than voltage VB. The voltage VB is higher than the voltage VA. The threshold voltage of the memory cell transistor MT holding "B" data is equal to voltage VB or higher and is lower than voltage VC. The voltage VC is higher than the voltage VB. The threshold voltage of the memory cell transistor MT holding "C" data is equal to voltage VC or higher and is lower than voltage VD. The voltage VD is higher than the voltage VC. The threshold voltage of the memory cell transistor MT holding "D" data is equal to VD or higher and is lower than voltage VE. The voltage VE is higher than the voltage VD. The threshold voltage of the memory cell transistor MT holding "E" data is equal to voltage VE or higher and is lower than voltage VF. The voltage VF is higher than the voltage VE. The threshold voltage of the memory cell transistor MT holding "F" data is equal to voltage VF or higher and is lower than voltage VG. The voltage VG is higher than the voltage VF. The threshold voltage of the memory cell transistor MT holding "G" data is equal to VG or higher and is lower than voltage VH. The voltage VH is higher than the voltage VG. The threshold voltage of the memory cell transistor MT holding "H" data is equal to voltage VH or higher and is lower than voltage VI. The voltage VI is higher than the voltage VH. The threshold voltage of the memory cell transistor MT holding "I" data is equal to voltage VI or higher and is lower than voltage VJ. The voltage VJ is higher than the voltage VI. The threshold voltage of the memory cell transistor MT holding "J" data is equal to VJ or higher and is lower than voltage VK. The voltage VK is higher than the voltage VJ. The threshold voltage of the memory cell transistor MT holding "K" data is equal to voltage VK or higher and is lower than voltage VL. The voltage VL is higher than the voltage VK. The threshold voltage of the memory cell transistor MT holding "L" data is equal to voltage VL or higher and is lower than voltage VM. The voltage VM is higher than the voltage VL. The threshold voltage of the memory cell transistor MT holding "M" data is equal to VM or higher and is lower than voltage VN. The voltage VN is higher than the voltage VM. The threshold voltage of the memory cell transistor MT holding "N" data is equal to voltage VN or higher and is lower than voltage VO. The voltage VO is higher than the voltage VN. The threshold voltage of the memory cell transistor MT holding "O" data is equal to VO or higher and is lower than voltage VREAD. The "O" data included in the 4-bit data is data corresponding to the highest threshold voltage.

The threshold distributions described above is achieved by the writing of the 4-bit (4-page) data including the lower bit, the upper bit, the higher bit, and the top bit. That is, the above-described data expressed in the decimal notation is related to the lower bit, the upper bit, the higher bit, and the top bit, as follows:

Er" data: "1111" (represented in the order of "Top/Higher/Upper/Lower)"
"A" data: "1110"
"B" data: "1010"
"C" data: "1000"
"D" data: "1001"
"E" data: "0001"
"F" data: "0000"
"G" data: "0010"
"H" data: "0110"
"I" data: "0100"
"J" data: "1100"
"K" data: "1101"
"L" data: "0101"
"M" data: "0111"
"N" data: "0011"
"O" data: "1011"

As can be seen from this, only 1 bit of the 4 bits changes between data corresponding to adjacent threshold levels.

Therefore, when the lower bit is read, a voltage corresponding to a boundary where the value ("0" or "1") of the lower bit changes may be used. This also applies to the upper bit, the higher bit, and the top bit.

That is, as depicted in FIG. 5, the lower page may be read by using, as read levels, voltage VA that distinguishes the "Er" data from the "A" data, voltage VD that distinguishes the "C" data from the "D" data, voltage VF that distinguished the "E" data from the "F" data, and voltage VK that distinguishes the "J" data from the "K" data. Read operations using voltages VA, VD, VF and VK will be referred to as read operations AR, DR, FR and KR.

Read operation AR is a process of determining whether or not the threshold voltage of the memory cell transistor MT is lower than voltage VA. Read operation DR is a process of determining whether or not the threshold voltage of the memory cell transistor MT is lower than voltage VD. Read operation FR is a process of determining whether or not the threshold voltage of the memory cell transistor MT is lower than voltage VF. Read operation KR is a process of determining whether or not the threshold voltage of the memory cell transistor MT is lower than voltage VK.

The upper page may be read by using, as read levels, voltage VC that distinguishes the "B" data from the "C" data, voltage VG that distinguishes the "F" data from the "G" data, voltage VI that distinguishes the "H" data from the "I" data, and voltage VM that distinguishes the "L" data from the "M" data. Read operations using voltages VC, VG, VI and VM will be referred to as read operations CR, GR, IR and MR.

Read operation CR is a process of determining whether or not the threshold voltage of the memory cell transistor MT is lower than voltage VC. Read operation GR is a process of determining whether or not the threshold voltage of the memory cell transistor MT is lower than voltage VG. Read operation IR is a process of determining whether or not the threshold voltage of the memory cell transistor MT is lower than voltage VI. Read operation MR is a process of determining whether or not the threshold voltage of the memory cell transistor MT is lower than voltage VM.

The higher page may be read by using, as read levels, voltage VB that distinguishes the "A" data from the "B" data, voltage VH that distinguishes the "G" data from the "H" data, and voltage VN that distinguishes the "M" data from the "N" data. Read operations using voltages VB, VH and VN will be referred to as read operations BR, HR and NR.

Read operation BR is a process of determining whether or not the threshold voltage of the memory cell transistor MT is lower than voltage VB. Read operation HR is a process of determining whether or not the threshold voltage of the memory cell transistor MT is lower than voltage VH. Read operation NR is a process of determining whether or not the threshold voltage of the memory cell transistor MT is lower than voltage VN.

The top page may be read by using, as read levels, voltage VE that distinguishes the "D" data from the "E" data, voltage VJ that distinguishes the "I" data from the "J" data, voltage VL that distinguishes the "K" data from the "L"

data, and voltage VO that distinguishes the "N" data from the "O" data. Read operations using voltages VE, VJ, VL, and VO will be referred to as read operations ER, JR, LR and OR.

Read operation ER is a process of determining whether or not the threshold voltage of the memory cell transistor MT is lower than voltage VE. Read operation JR is a process of determining whether or not the threshold voltage of the memory cell transistor MT is lower than voltage VJ. Read operation LR is a process of determining whether or not the threshold voltage of the memory cell transistor MT is lower than voltage VL. Read operation OR is a process of determining whether or not the threshold voltage of the memory cell transistor MT is lower than voltage VO (namely, whether or not the held data is "O").

1.2 Read Operation

Figure 6:
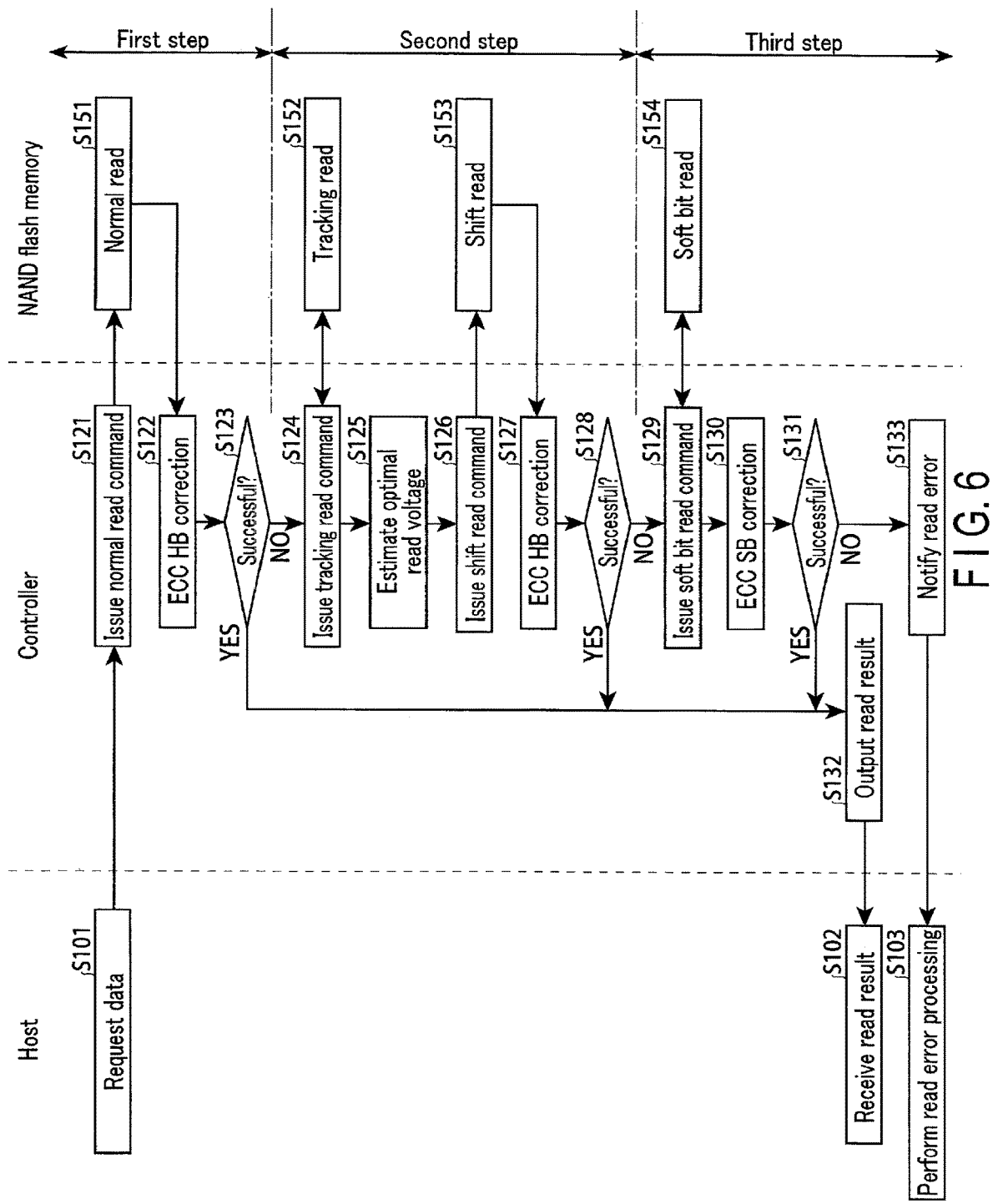
FIG. 6 is a flowchart illustrating a read operation performed according to the first embodiment.

Next, a description will be given of a read operation according to the present embodiment. FIG. 6 is a flowchart illustrating the read operation. In FIG. 6, the operation of the NAND flash memory 100 is executed under the control of the sequencer 160, and the operation of the controller 200 is executed under the control of the processor 230.

As depicted in FIG. 6, the read operation according to the present embodiment generally includes the following three steps:

First Step: Normal Read
Second Step: Search for Optimal Read Voltage by Vth Tracking and Shift Read
Third Step: Soft Bit Read and Soft Decision In the description below, the soft bit read will be explained in detail, focusing on the lower page reading.

1.2.1 First Step

The first step will be described. First, the processor 230 of the controller 200 issues a normal read command in response to a data request made by the host device 300, and transmits the command to the NAND flash memory 100 (steps S101 and S121).

The normal read command is stored, for example, in the command register 152 of the NAND flash memory 100. In response to this, the sequencer 160 executes normal reading (step S151). That is, the sequencer 160 executes the read operations AR, DR, FR and KR described with reference to FIG. 5. In read operations AR, DR, FR and KR, default read voltages VA, VD, VF and VK are applied to selected word line WLi (i: an integer larger than or equal to 0) and voltage VREAD is applied to unselected word lines WL. Voltage VREAD is a voltage high enough to turn on memory cell transistor MT regardless of the data held therein. When signal STB is asserted, the data read onto the bit line is supplied to the sense amplifier SA in read operations AR, DR, FR and KR.

The data read in step S151 is supplied via the NAND interface and is stored, for example, in the buffer memory 240 of the controller 200. The ECC circuit 260 checks whether or not the read data contains an error, and, if the error is detected, attempts correction of the data (hard bit decoding) (step S122). If the error correction can be made (YES in step S123), the controller 200 outputs the corrected data to the host device 300 (step S132). As a result, the data requested in step S101 is supplied to the host device 300 (step S102).

On the other hand, if the read data contains too many errors to correct (NO in step S123), the read operation proceeds to the second step.

1.2.2 Second Step

In the second step, optimal values of the read voltages in read operations AR, DR, FR and KR are estimated, and data is read again using the estimated voltages. Although various methods are applicable to the estimation of optimal values, the present embodiment will be described, referring to the case where tracking read is used and the intersections of threshold value distributions are regarded as optimal values.

To be specific, the threshold distributions shown in FIG. 5 are separate from each other and can be discriminated from each other by use of voltages VA through VO. Such threshold distributions are ideal distributions. However, when a certain time elapses after the writing of data, the threshold distributions tend to widen, and, in some cases, overlap each other. This state is illustrated in FIG. 7. Although only "Er" through "C" levels are shown in FIG. 7, the "D" level and higher levels undergo the same phenomenon. In particular, in the case of a low threshold distribution such as the "Er" level, the higher side portion of the distribution tends to shift to the high voltage side. Likewise, in the case of a high threshold distribution such as the "0" level, the lower side portion of the distribution tends to shift to the lower voltage side.

Where the distribution widths of the threshold distributions increase and the adjacent threshold distributions overlap each other, default read voltages VA, VD, VF and VK used for the lower page may not be necessarily optimal voltages. In this case, if data is read using read voltages VA, VD, VF and VK, the read data may contain many errors that cannot be corrected by hard bit decoding.

In the second step, therefore, the intersection between the threshold distributions of the "Er" level and "A" level, the intersection between the threshold distributions of the "C" level and "D" level, the intersection between the threshold distributions of the "E" level and "F" level and the intersection between the threshold distributions of the "J" level and "K" level are searched for, and these intersections are used as new optimal read voltages VA', VD', VF' and VK'. The "optimal value" and "optimal read voltage" are intended to mean a "read voltage that enables correction (hard bit decoding) of data" and do not necessarily mean an optimal value that minimizes the number of errors which may be contained.

To be specific, the processor 230 of the controller 200 issues a tracking read command (step S124), and transmits the command to the NAND flash memory 100. The tracking read command is stored, for example, in the command register 152 of the NAND flash memory 100. In response to this, the sequencer 160 executes Vth tracking read (step S152).

The Vth tracking read is an operation of reading data while changing the value of the read voltage within a range including read voltage VA, and the number of ON cells is counted thereby. The number of ON cells counted at each read voltage is stored, for example, in the RAM 220 of the controller 200. The processor 230 estimates which voltage is optimal to read operation AR (step S125). For example, where VA1 through Van (n: a natural number more than or equal to 2) are used as the read voltage, the difference between the number of ON cells counted at VAj (j: a natural number more than or equal to 2) and the number of ON cells counted at VA(j−1) is calculated, and the voltage that makes this difference minimal is regarded as the intersection between the threshold distribution of the "Er" level and the threshold distribution of the "A" level, namely, as optimal read voltage VA' of read operation AR. As for optimal read voltages VD', VF' and VK' of the other read operations DR, FR and KR, the intersections may be obtained by performing Vth tracking read in a similar manner to that of read operation AR. Alternatively, optimal read voltages VD', VF' and VK' may be estimated based on the obtained optimal read voltage VA', without performing the Vth tracking read.

The CPU 230 of the controller 200 issues a shift read command (step S126), and transmits the command to the NAND flash memory 100 together with a voltage shift amount. The voltage shift amount indicates the differences between default read voltages VA, VD, VF and VK and optimal read voltages VA', VD', VF' and VK' estimated in step S125. Needless to say, the optimal read voltages VA', VD', VF' and VK' themselves may be transmitted to the NAND flash memory 100, instead of the differences. The shift read command is stored, for example, in the command register 152 of the NAND flash memory 100. The voltage shift amount is stored in the voltage designation register 154. In response to this, the sequencer 160 executes a shift read (step 153), using voltages VA', VD', VF' and VK' obtained in step S125. The shift read is similar to the normal read except that the read voltage is shifted.

The data read in step S153 is supplied via the NAND interface and is stored in the buffer memory 240 of the controller 200. The ECC circuit 260 checks whether or not the read data contains an error, and, if the error is detected, attempts correction of the data (hard bit decoding) (step S127). If the error correction can be made (YES in step S128), the controller 200 outputs the corrected data to the host device 300 (step S132). On the other hand, if the error correction cannot be made (NO in step S128), the read operation proceeds to the third step.

1.2.3 Third Step

In the third step, a soft bit is generated by performing a soft bit read, and error correction (soft bit decoding) is made based on the generated soft bit. The third step will be described in detail.

1.2.3.1 Soft Bit Data

Figure 8:
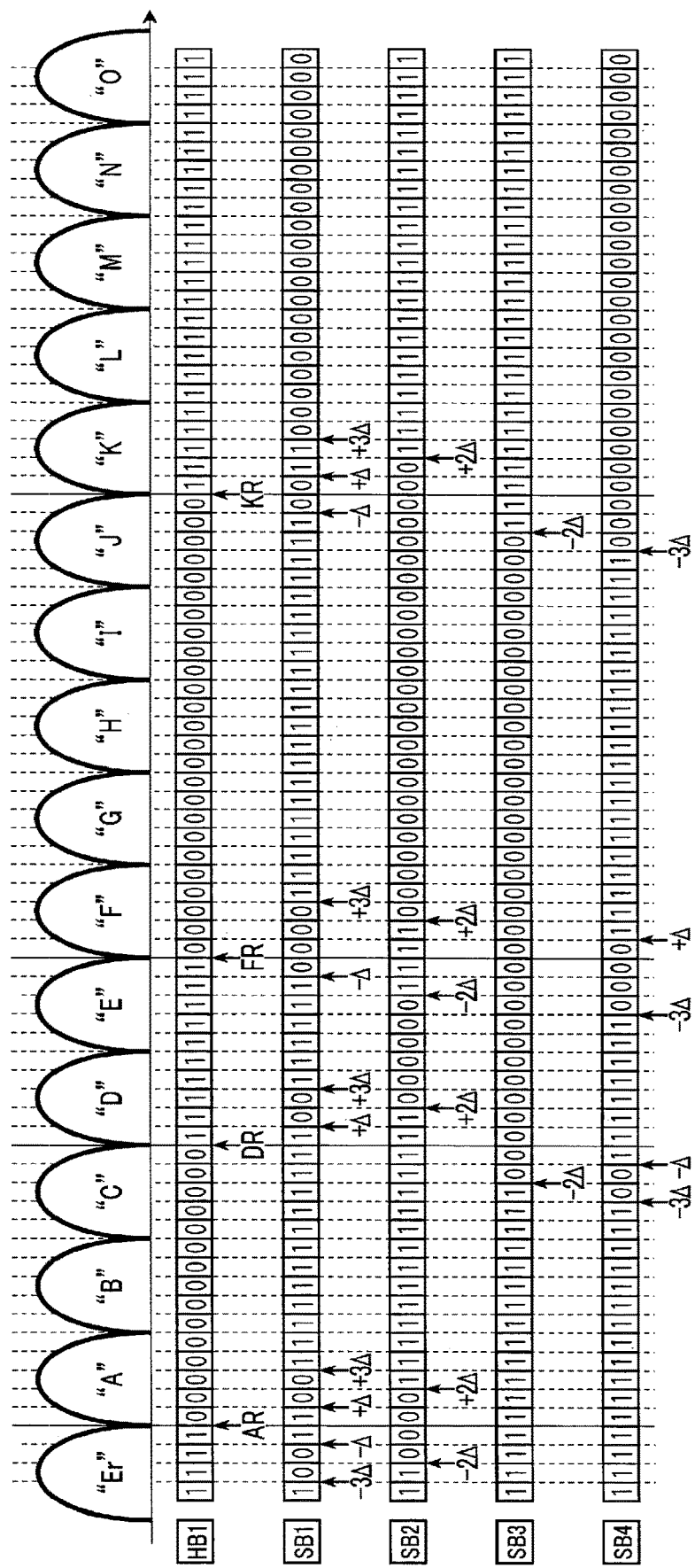
FIG. 8 shows a conceptual diagram illustrating threshold distributions of memory cells according to the first embodiment and relationships between hard bits and soft bits of a lower page.

First, soft bit data according to the present embodiment will be described with reference to FIG. 8. FIG. 8 shows a conceptual diagram illustrating threshold distributions of memory cells according to the present embodiment, as well as hard bit data and soft bit data on the lower page corresponding to the threshold distributions.

As shown in FIG. 8, the hard bit data of the lower page is finally determined by the above-mentioned four read operations AR, DR, FR and KR, and the read voltages used for the read operations AR, DR, FR and KR are as follows:
Read Operation AR: voltage VA'
Read Operation DR: voltage VD'
Read Operation FR: voltage VF'
Read Operation KR: voltage VK'

On the other hand, the soft bit data according to the present embodiment is 4-bit data (SB1 through SB4) and is generated based on the data that is read, using voltages shifted from the above-mentioned four voltages VA', VD', VF' and VK'.

Soft bit data SB1 is finally determined by the eleven read operations set forth below. In the following, voltage $\Delta$ represents a unit shift amount of the read voltage.
Read Operation (AR$-3\Delta$R): voltage (VA'$-3\Delta$)
Read Operation (AR$-\Delta$R): voltage (VA'$-\Delta$)
Read Operation (AR$+\Delta$R): voltage (VA'$+\Delta$)
Read Operation (AR$+3\Delta$R): voltage (VA'$+3\Delta$)
Read Operation (DR$+\Delta$R): voltage (VD$+\Delta$)
Read Operation (DR$+3\Delta$R): voltage (VD'$+3\Delta$)
Read Operation (FR$-\Delta$R): voltage (VF'$-\Delta$)
Read Operation (FR$+3\Delta$R): voltage (VF'$+3\Delta$)
Read Operation (KR$-\Delta$R): voltage (VK'$-\Delta$)
Read Operation (KR$+\Delta$R): voltage (VK'$+\Delta$)
Read Operation (KR$+3\Delta$R): voltage (VK'$+3\Delta$)

Soft bit data SB2 is finally determined by the six read operations set forth below.
Read Operation (AR$-2\Delta$R): voltage (VA'$-2\Delta$)
Read Operation (AR$+2\Delta$R): voltage (VA'$+2\Delta$)
Read Operation (DR$+2\Delta$R): voltage (VD'$+2\Delta$)
Read Operation (FR$-2\Delta$R): voltage (VF'$-2\Delta$)
Read Operation (FR$+2\Delta$R): voltage (VF'$+2\Delta$)
Read Operation (KR$+2\Delta$R): voltage (VK'$+2\Delta$)

Soft bit data SB3 is finally determined by the two read operations set forth below.
Read Operation (DR$-2\Delta$R): voltage (VD'$-2\Delta$)
Read Operation (KR$-2\Delta$R): voltage (VK'$-2\Delta$)

Soft bit data SB4 is finally determined by the five read operations set forth below.
Read Operation (DR$-3\Delta$R): voltage (VD'$-3\Delta$)
Read Operation (DR$-\Delta$R): voltage (VD'$-\Delta$)
Read Operation (FR$-3\Delta$R): voltage (VF'$-3\Delta$)
Read Operation (FR$+\Delta$R): voltage (VF'$+\Delta$)
Read Operation (KR$-3\Delta$R): voltage (VK'$-3\Delta$)

As described above, the 4-bit soft bit data SB1 through SB4 can be obtained by repeating a read operation 24 times. In the third step, soft decision is made using these soft bits SB1 through SB4, and data is decoded (soft bit decoding).

1.2.3.2 General Flow of Third Step

First, a general flow of the third step will be described. If the hard bit decoding ends in failure in the second step (NO in step S128), the CPU 230 of the controller 200 issues a soft bit read command (step S129), as shown in FIG. 6, and transmits the command to the NAND flash memory 100. The soft bit read command issued in step S129 first sets various read conditions in the NAND flash memory 100.

Subsequently, data is read from a memory cell and stored in a designated latch circuit. This is repeated 24 times in the case of the lower page described with reference to FIG. 8. Finally, hard bit HB and soft bits SB1 through SB4 are held in the latch circuits of the column control circuit 140 under the read conditions.

The controller 200 reads hard bit HB and soft bits SB1 through SB4 from the column control circuit 140 and stores them, for example, in the buffer memory 240. The ECC circuit 260 makes soft decision using the read hard bit HB and soft bits SB1 through SB4, and attempts error correction (soft bit decoding) (step S130). If the error correction can be made (YES in step S131), the controller 200 outputs the corrected data to the host device 300 (steps S132 and S102). On the other hand, if the error correction cannot be made (NO in step S131), the processor 230 notifies the host device 300 that the read operation ends in failure (step S133), and the host device 300 performs error processing (step S103).

1.2.3.2 Command Sequences and Detailed Operation

Next, command sequences in steps S129 and S154 and a detailed operation of the NAND flash memory 100 will be described.

Figure 9:
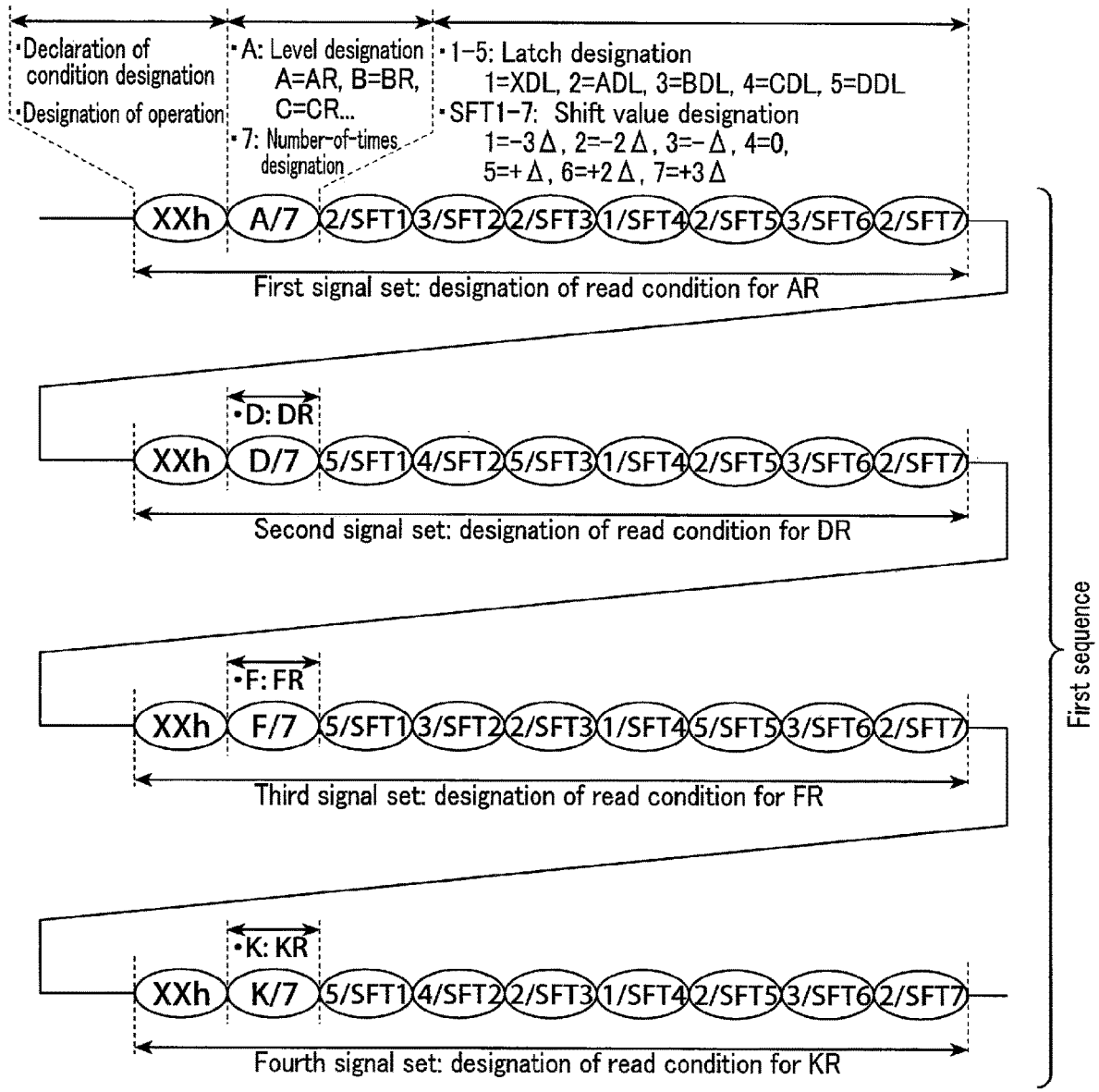

FIG. 9 and FIG. 10 show an example of a command sequence which is transmitted from the controller 200 to the NAND flash memory 100 in step S129 and which is used for soft bit read of the lower page. Broadly speaking, the command sequence according to the present embodiment includes the following three sequences:
First Sequence: setting of read conditions (9 cycles×4 times shown in FIG. 9)
Second Sequence: reading of data from memory cell, storing data in latch, and performing operations (first 8 cycles shown in FIG. 10)
Third Sequence: reading of HB and SB1 to SB4 from latch (seven cycle+eight cycles×four times, shown in FIG. 10)

<First Sequence>

The first sequence will be described with reference to FIG. 9. In the first sequence, read conditions of read operations AR, DR, FR and KR are set in the NAND flash memory 100.

As shown in FIG. 9, the read conditions of each read operation are set based on signal sets which the controller 200 provides in nine cycles. The first signal set initially transmitted relates to read operation AR, the second signal set transmitted next relates to read operation DR, the third signal set transmitted subsequently relates to read operation FR, and the fourth signal set transmitted last time relates to read operation KR.

The first cycle of the nine-cycle signal of each signal set is command "XXh." Command "XXh" declares that read conditions are to be set and designates an operation to be performed by the latch circuits of the column control circuit 140. In the case of the soft bit operation method illustrated in FIG. 8, read data is inverted when data is initially stored in each of latch circuits ADL, BDL, CDL, DDL and XDL (assuming that data is "0" data when a memory cell is turned on, "1" data is stored in the latch circuit). In the second and subsequent times, an exclusive logical add (XOR) operation is performed with respect to the read data and the data that is kept stored in the corresponding latch circuit until then.

The second-cycle signal designates a read level and a number of read times. In the first signal set shown in FIG. 9, "A/7" is described, of which "A" indicates read operation AR and "7" indicates that a shift read is to be performed seven times. "D/7" in the second signal set designates read operation DR and indicates that a shift read is to be performed seven times, "F/7" in the third signal set designates read operation FR and indicates that a shift read is to be performed seven times, "K/7" in the fourth signal set designates read operation KR and indicates that a shift read is to be performed seven times.

The third through ninth cycle signals designate latch circuits in which read data obtained in the shift read performed by the number of times designated in the second cycle signal is to be stored, and also designates a shift amount of the read voltage used in the shift read. In the third cycle of the first signal set shown in FIG. 9, "2/SFT1" is described, of which the number preceding "/" designates a latch circuit. To be specific, "2" designates latch circuit ADL, "1" designates latch circuit XDL, "3" designates latch circuit BDL, "4" designates latch circuit CDL, and "5" designates latch circuit DDL. The symbol subsequent to the slash "/" designates a shift amount. "SFT1" designates "−3Δ", "SFT2" designates "−2Δ", "SFT3" designates "−Δ", "SFT4" designates "0", "SFT5" designates "+1Δ", "SFT6" designates "+2Δ", and "SFT7" designates "+3Δ."

The information mentioned above is stored, for example, in the register group 150 of the NAND flash memory 100. FIG. 11 is a conceptual diagram illustrating how the command register 152, latch designation register 153, voltage designation register 154, number-of-times designation register 155 and sequencer (or column control circuit 140) are after the first sequence is received.

As shown in FIG. 11, the designated read operations AR, DR, FR and KR are held in the command register 152, and the number of read times (seven times) in each read operation is held in the number-of-times register 155. The voltage shift amounts (±3Δ, ±2Δ, ±Δ and 0) in the seven read operations are stored in the voltage designation register 154.

The seven data read operations in read operation AR will be referred to as AR1 to AR7 in the ascending order of read voltage. AR1 to AR7 may be referred to as (AR−3ΔR), (AR−2ΔR), (AR−ΔR), AR, (AR+ΔR), (AR+2ΔR), and (AR+3ΔR), respectively. This holds true for read operations DR, FR and KR as well.

The latch circuits which are to store data read in read operations AR1 through AR7, DR1 through DR7, FR1 through FR7 and KR1 through KR7 are designated in the latch designation register 153. The operations to be executed when the data is stored in the latch circuits are designated in the sequencer 160 or the latch circuit (or the arithmetic module OP). The information may be retained in registers provided independently.

<Second Sequence>

The second sequence will be described with reference to FIG. 10. FIG. 10 illustrates signals which are to be transmitted and received after the signals shown in FIG. 9. In the second sequence, an instruction is supplied to the NAND flash memory 100 such that data is read from the memory cells based on the conditions set in the first sequence.

As shown in FIG. 10, the second sequence includes the prefix command "YYh" added before the normal read sequences (00h-ADD×5-30h). The command "YYh" is to instruct execution of the soft bit read based on the conditions set in the first sequence and also to instruct generation of soft bits SB1 through SB4 with respect to the lower page. Subsequent to command "YYh", command "00h" declares address input, and address ADD is input over five cycles. By this address ADD, the block BLK and page to be read are designated. In response to command "30h", the sequencer 160 starts reading data from a memory cell, and the NAND flash memory becomes busy.

Figure 12:
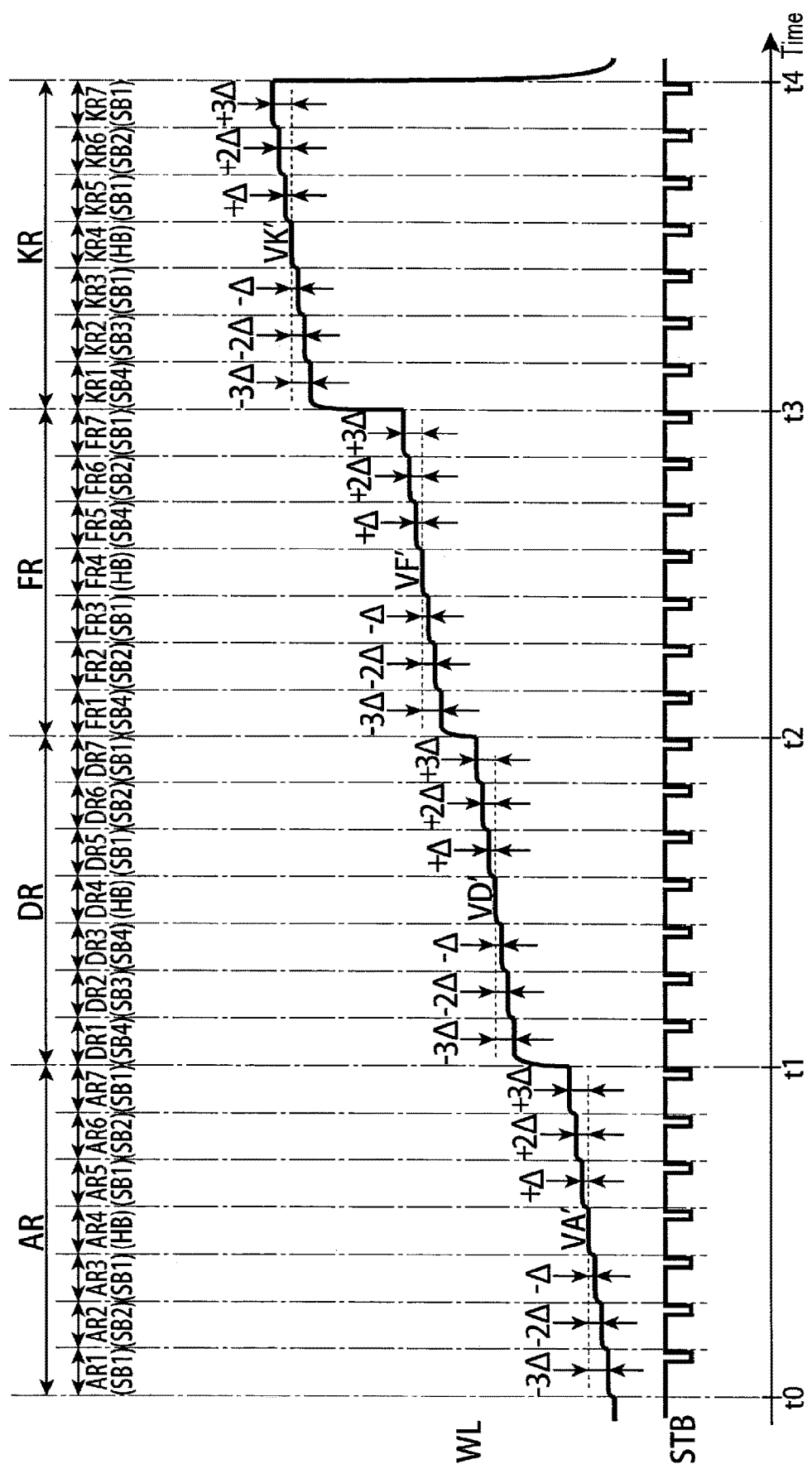
FIG. 12 is a timing chart showing how a word line voltage changes with time when a soft bit read is performed according to the first embodiment.

FIG. 12 is a timing chart showing the voltage applied to a selected word line WL and strobe signal STB supplied to the column control circuit 140, when the NAND flash memory 100 performs a read operation.

As shown in FIG. 12, in the present embodiment, read operations AR, DR, FR and KR are performed successively, and data strobing is performed seven times in each read operation. To be specific, read operation AR is performed in the period from time t0 through time t1. The voltage applied to selected word line WL is sequentially stepped up from the voltage which is 3Δ lower than voltage VA' estimated in step S125 of FIG. 6 through the voltage which is 3Δ higher than VA', and in this state data is read (AR1 through AR7).

Read operation DR is performed in the period from time t1 through time t2. The voltage applied to selected word line WL is sequentially stepped up from the voltage which is 3Δ lower than voltage VD' estimated in step S125 of FIG. 6 through the voltage which is 3Δ higher than VD', and in this state data is read (DR1 through DR7).

Read operation FR is performed in the period from time t2 through time t3. The voltage applied to selected word line WL is sequentially stepped up from the voltage which is 3Δ lower than voltage VF' estimated in step S125 of FIG. 6 through the voltage which is 3Δ higher than VF', and in this state data is read (FR1 through FR7).

Read operation KR is performed in the period from time t3 through time t4. The voltage applied to selected word line WL is sequentially stepped up from the voltage which is 3Δ lower than voltage VK' estimated in step S125 of FIG. 6 through the voltage which is 3Δ higher than VK', and in this state data is read (KR1 through KR7).

Read operations AR, DR, FR and KR described above will be explained in more detail, with special attention paid to the latch circuits of the column control circuit 140. First, the sequencer 160 recognizes that read operations AR, DR, FR and KR are to be executed, based on the information stored in the command register 152. Based on the information stored in the number-of-times designation register 155 and the information stored in the voltage designation register 154, the sequencer 160 also recognizes that in each of the read operations AR, DR, FR and KR, data is to be read seven times, with the voltage applied to the word line WL being shifted from −3Δ through +3Δ. In addition, based on the information in the latch designation register 153, the sequencer 160 recognizes which latch circuit is to be used for storing data read seven times in each of read operations AR, DR, FR and KR, and further recognizes what operation is required then.

Figure 13:
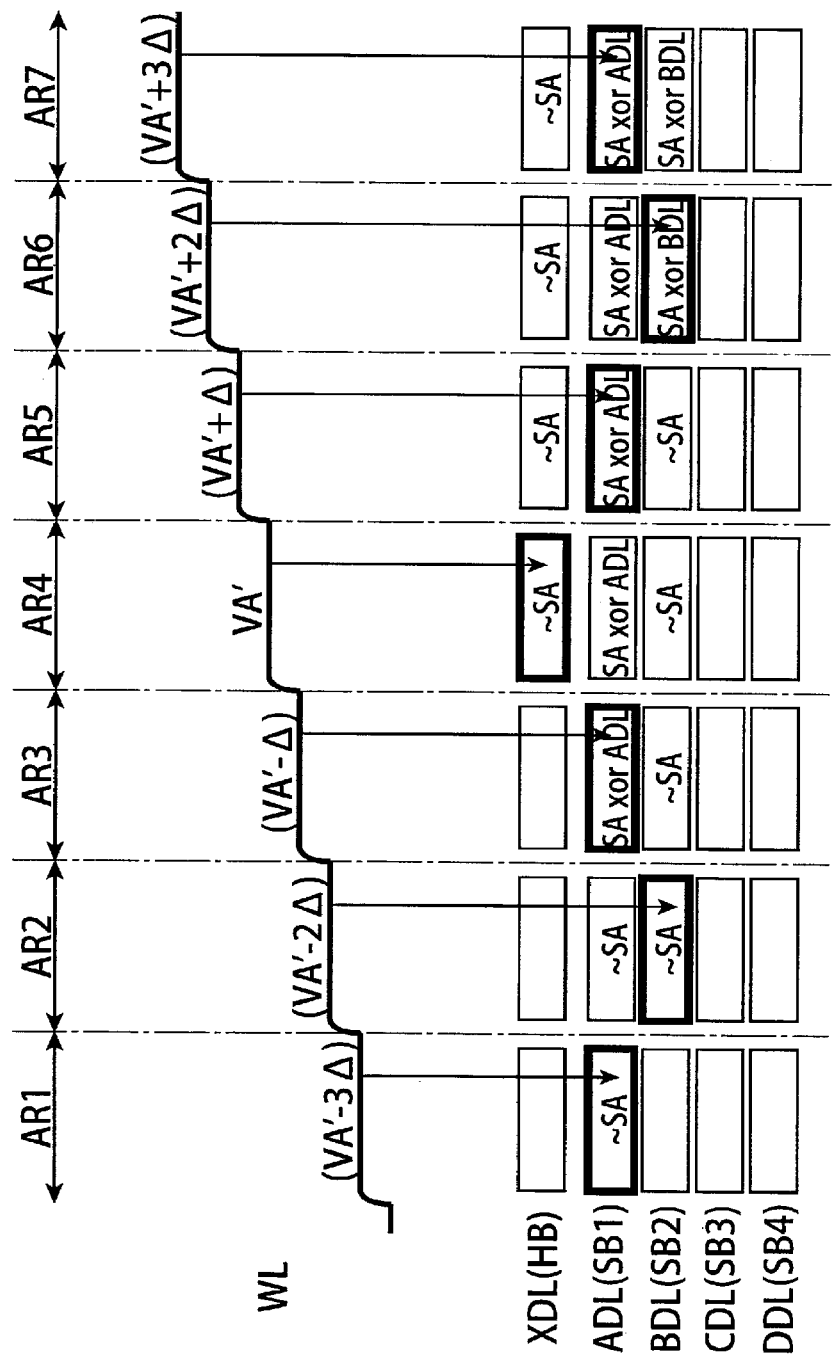

Based on the information mentioned above, the sequencer 160 starts read operation AR first. FIG. 13 is a schematic diagram showing how the voltage of selected word line WL and latch circuits XDL, ADL, BDL, CDL and DDL are when read operation AR is executed. As described above, in the present embodiment, the row decoder 120 sequentially steps up the voltage applied to the selected word line WL from the voltage 3Δ lower than voltage VA' through the voltage 3Δ higher than voltage VA'. These voltages are expressed as (VA'−3Δ), (VA'−2Δ), (VA'−Δ), VA', (VA'+Δ), (VA'+2Δ) and (VA'+3Δ), and the read operations performed using the voltages are AR1 through AR7. This holds true for read operations DR, FR and KR as well.

The data read in read operation AR1 is stored in latch circuit ADL in accordance with the information stored in the latch designation register 153. At the time, the read data is inverted and stored in latch circuit ADL. The inverted read data will be represented as "~SA", and "~" indicates the inverted state. In the present embodiment, the data read from an ON cell is defined as "0." Therefore, "0" data is read from the memory cell that is turned on by read voltage (VA'−3Δ), and "1" data obtained by inverting the read data is stored in latch circuit ADL. On the other hand, "1" data is read from memory cells that are in the OFF state, and the "0" data is stored in latch circuit ADL. At this point of time, latch circuits XDL, BDL, CDL and DDL are idle (in the reset state).

Subsequently, voltage (VA'−2Δ) is applied to selected word line WL, and read operation AR2 is performed. The data read in read operation AR2 is inverted and stored in latch circuit BDL. Latch circuit ADL continues to retain the inverted data of the data read in read operation AR1.

Subsequently, voltage (VA'−Δ) is applied to selected word line WL, and read operation AR3 is performed. The data read in read operation AR3 and the data kept stored in latch circuit ADL until then are subjected to an XOR operation, and the operation result is stored in latch circuit ADL, replacing the data stored until then. The XOR operation may be performed, for example, by the arithmetic module OP.

Subsequently, voltage VA' is applied to selected word line WL, and read operation AR4 is performed. The data read in read operation AR4 is inverted and stored in latch circuit XDL. That is, read operation AR4 is a hard bit read.

Subsequently, voltage (VA'+Δ) is applied to selected word line WL, and read operation AR5 is performed. The data read in read operation AR5 and the data kept stored in latch circuit ADL until then are subjected to an XOR operation, and the operation result is stored in latch circuit ADL, replacing the data stored until then.

Subsequently, voltage (VA'+2Δ) is applied to selected word line WL, and read operation AR6 is performed. The data read in read operation AR6 and the data kept stored in latch circuit BDL until then are subjected to an XOR operation, and the operation result is stored in latch circuit BDL, replacing the data stored until then.

Finally, voltage (VA'+3Δ) is applied to selected word line WL, and read operation AR7 is performed. The data read in read operation AR7 and the data kept stored in latch circuit ADL until then are subjected to an XOR operation, and the operation result is stored in latch circuit ADL, replacing the data stored until then.

Figure 14:
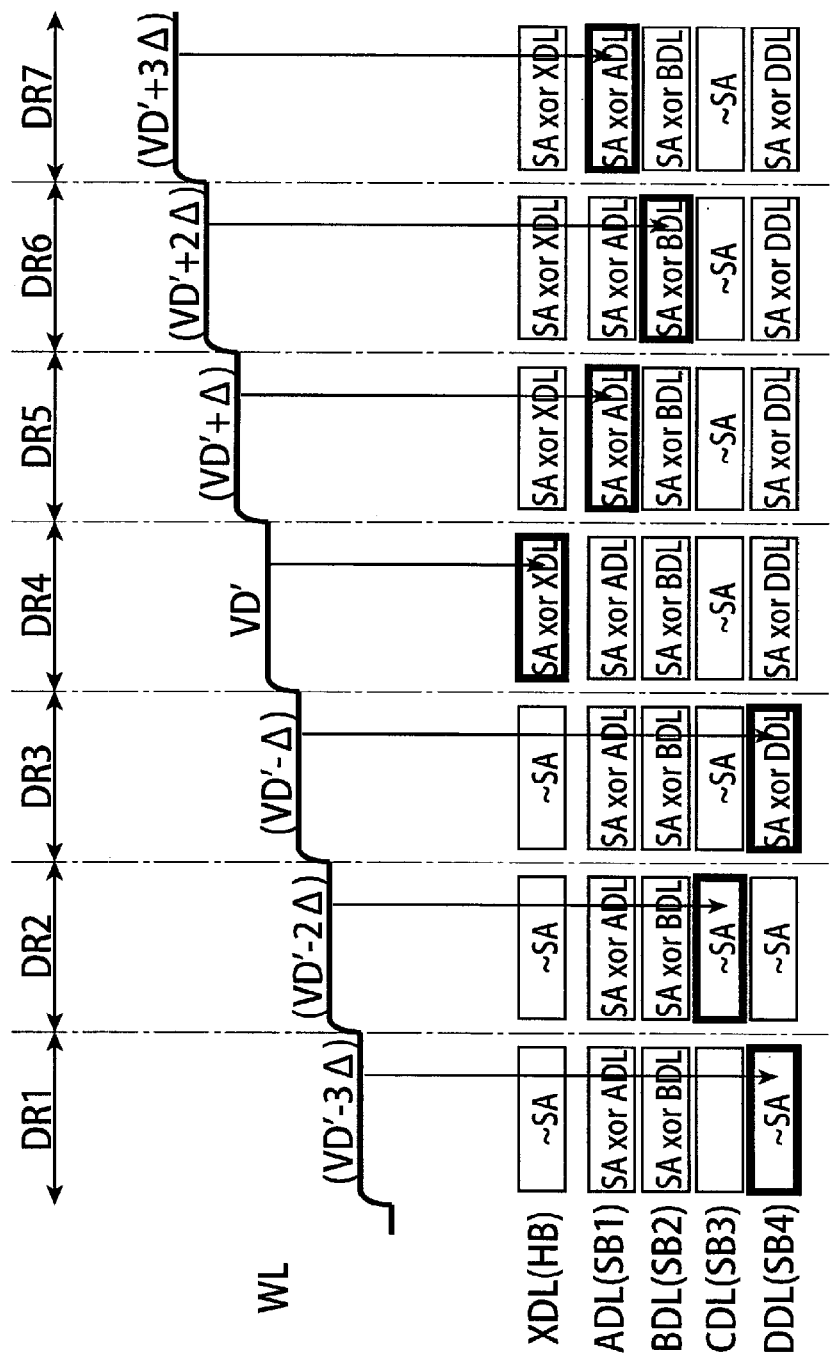

In the manner described above, read operation AR is completed. As a result, the following data is stored in the latch circuits of the column control circuit 140:
XDL=~AR4
ADL=~AR1 xor AR3 xor AR5 xor AR7
BDL=~AR2 xor AR6
CDL=empty
DDL=empty Next, the sequencer 160 starts read operation DR. FIG. 14 is a schematic diagram showing how the voltage of a selected word line WL and latch circuits XDL, ADL, BDL, CDL and DDL are when read operation DR is executed.

First, voltage (VA'+3Δ) is applied to selected word line WL, and read operation DR1 is performed. The data read in read operation DR1 is inverted and stored in latch circuit DDL. Subsequently, voltage (VD'−2Δ) is applied to selected word line WL, and read operation DR2 is performed. The data read in read operation DR2 is inverted and stored in latch circuit CDL. Subsequently, voltage (VD'−Δ) is applied to selected word line WL, and read operation DR3 is performed. The data read in read operation DR3 and the data kept stored in latch circuit BDL until then are subjected to an XOR operation, and the operation result is stored in latch circuit DDL, replacing the data stored until then. Subsequently, voltage VD' is applied to selected word line WL, and read operation DR4 is performed. Read operation DR4 is a hard bit read. The data read in read operation DR4 and the data kept stored in latch circuit XDL until then are subjected to an XOR operation, and the operation result is stored in latch circuit XDL, replacing the data stored until then. Subsequently, voltage (VD'+Δ) is applied to selected word line WL, and read operation DR5 is performed. The data read in read operation DR5 and the data kept stored in latch circuit ADL until then are subjected to an XOR operation, and the operation result is stored in latch circuit ADL, replacing the data stored until then. Subsequently, voltage (VD'+2Δ) is applied to selected word line WL, and read operation DR6 is performed. The data read in read operation DR6 and the data kept stored in latch circuit BDL until then are subjected to an XOR operation, and the operation result is stored in latch circuit BDL, replacing the data stored until then. Finally, voltage (VD'+3Δ) is applied to selected word line WL, and read operation DR7 is performed. The data read in read operation DR7 and the data kept stored in latch circuit ADL until then are subjected to an XOR operation, and the operation result is stored in latch circuit ADL, replacing the data stored until then.

In the manner described above, read operation DR is completed. As a result, the following data is stored in the latch circuits of the column control circuit 140:
XDL=~AR4 xor DR4
ADL=~AR1 xor AR3 xor AR5 xor AR7 xor DR5 xor DR7
BDL=~AR2 xor AR6 xor DR6
CDL=~DR2
DDL=~DR1 xor DR3

Figure 15:
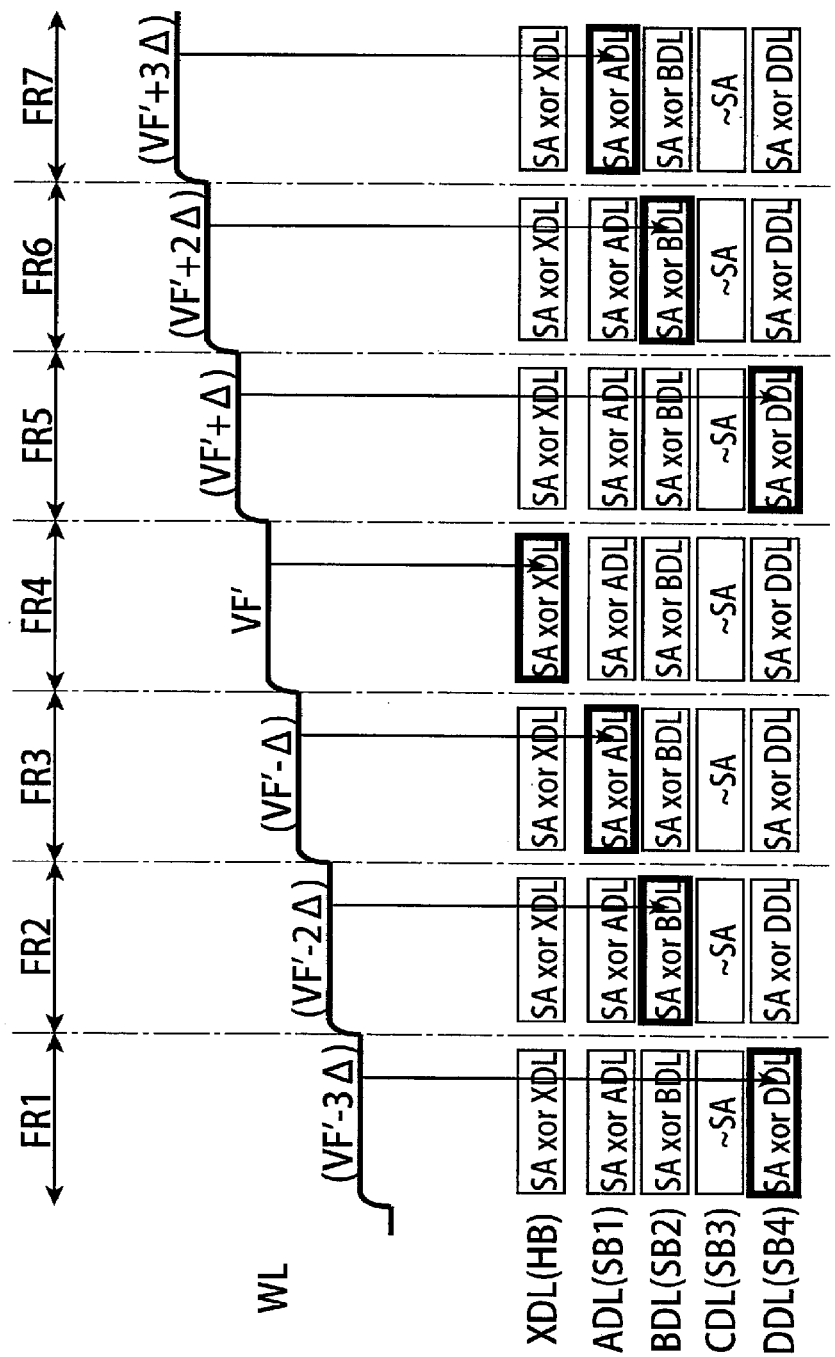

Next, the sequencer 160 starts read operation FR. FIG. 15 is a schematic diagram showing how the voltage of a selected word line WL and latch circuits XDL, ADL, BDL, CDL and DDL are when read operation FR is executed.

Since read operation FR is similar to read operations AR and DR mentioned above, a detailed description of read operation FR will be omitted. In read operation FR, the data read in read operations AR1 through AR7 and the data stored in latch circuits DDL, BDL, ADL, XDL, DDL, BDL and ADL are subjected to an XOR operation, respectively, and the operation results are stored in the respective latch circuits, replacing the data stored until then. As a result, the following data is stored in the latch circuits of the column control circuit 140:

XDL=~AR4 xor DR4 xor FR4
ADL=~AR1 xor AR3 xor AR5 xor AR7 xor DR5 xor DR7 xor FR3 xor FR7
BDL=~AR2 xor AR6 xor DR6 xor FR2 xor FR6
CDL=~DR2
DDL=~DR1 xor DR3 xor FR1 xor FR5

Next, the sequencer 160 starts read operation KR. FIG. 16 is a schematic diagram showing how the voltage of a selected word line WL and latch circuits XDL, ADL, BDL, CDL and DDL are when read operation KR is executed.

Although a detailed description of read operation KR is omitted, the data read in read operations KR1 through KR7 and the data stored in latch circuits DDL, CDL, ADL, XDL, ADL, BDL and ADL are sequentially subjected to an XOR operation, and the operation results are stored in the respective latch circuits, replacing the data stored until then. As a result, the following data is stored in the latch circuits of the column control circuit 140:

XDL=~AR4 xor DR4 xor FR4 xor KR4
ADL=~AR1 xor AR3 xor AR5 xor AR7 xor DR5 xor DR7 xor FR3 xor FR7 xor KR3 xor KR5 xor KR7
BDL=~AR2 xor AR6 xor DR6 xor FR2 xor FR6 xor KR6
CDL=~DR2 xor KR2
DDL=~DR1 xor DR3 xor FR1 xor FR5 xor KR1

The data finally stored in latch circuit XDL is hard bit HB, the data finally stored in latch circuit ADL is soft bit SB1, the data finally stored in latch circuit BDL is soft bit SB2, the data finally stored in latch circuit CDL is soft bit SB3, and the data finally stored in latch circuit DDL is soft bit SB4. As shown in FIG. 16, hard bit HB and soft bits SB1 through SB4 are completed when read operations KR4, KR7, KR6, KR2 and KR1 come to an end.

<Third Sequence>

The third sequence will be now described. In the third sequence, hard bit HB and soft bits SB1 through SB4 obtained in the processing illustrated in FIG. 16 are read from the NAND flash memory 100 to the controller 200.

As shown in FIG. 10, in the third sequence, data is read from the latch circuits to the controller 200 by use of register read commands ("05h"-"ADD"-"E0h"). Since hard bit HB is already stored in latch circuit XDL then, it can be transferred to the controller 200 by issuing a normal register read command.

On the other hand, soft bits SB1 through SB4 are stored in latch circuits ADL, BDL, CDL and DDL. Therefore, the controller 200 transfers the data in latch circuits ADL, BDL, CDL and DDL to latch circuit XDL by issuing, for example, a prefix command "ZZh." Thereafter, any one of soft bits SB1 through SB4 stored in latch circuit XDL can be transferred to the controller 200 by issuing a normal register read command.

1.3 Advantages of Present Embodiment

According to the configurations of the present embodiment, a semiconductor memory device having an improved operation performance can be provided. A description will be given of the advantages.

As described with reference to, for example, FIG. 9 and FIG. 10, in the present embodiment, the controller 200 issues various setting commands regarding the read conditions (first sequence) before it issues actual read commands (second sequence) to read data. In the present embodiment, the following read conditions are designated:

operation performed in latch circuits
read levels
number of times a read operation is repeated
latch circuits to store data
shift amounts of read voltage After setting these conditions in the NAND flash memory 100, the controller 200 issues read commands by which to read data from the memory cells. In accordance with the set conditions, the NAND flash memory 100 performs data reading and operations. In the present embodiment, hard bit HB and soft bits SB1 through SB4 are held in the latch circuits of the column control circuit 140 as a result of the data reading based on the second sequence. According to the present embodiment, read commands of the second sequence do not have to be issued each time the read conditions are changed. Accordingly, the NAND flash memory 100 has improved usability for the controller 200. In addition, a command for reading data from a memory cell does not have to be issued again and again, and this contributes to an increase in the operating speed.

An increase in the operating speed is significantly noticeable in the calculation of soft bits SB described in connection with the present embodiment. For example, when soft bit SB is calculated in the manner described with reference to FIG. 8, the read voltage may not be symmetric, but the controller 200 can easily control the NAND flash memory 100 and the calculation speed of soft bits SB can be increased, accordingly.

The symmetry of the read voltage is intended to mention the following: Let us assume that in the coding described with reference to FIG. 5, $(-2\Delta)$ is used as a shift amount when soft bit SB of a lower page is obtained. In this case, the soft bit read includes $(AR-2\Delta R)$, $(AR+2\Delta R)$, $(DR-2\Delta R)$, $(DR+2\Delta R)$, $(FR-2\Delta R)$, $(FR+2\Delta R)$, $(KR-2\Delta R)$ and $(KR+2\Delta R)$. As in this example, the symmetry is intended to mention that the voltage at each read level is shifted in the same amount in both the positive direction and the negative direction.

In the present embodiment, a soft bit read for obtaining soft bit SB1 includes $(AR-3\Delta)$, $(AR-\Delta)$, $(AR+\Delta)$, $(AR+3\Delta)$, $(DR+\Delta)$, $(DR+3\Delta)$, $(FR-\Delta)$, $(FR+3\Delta)$, $(KR-\Delta)$, $(KR+\Delta)$ and $(KR+3\Delta)$, as shown in FIG. 8. By making the read voltage asymmetric in this manner, the number of bits of soft bits SB can be reduced. Even where a read voltage is not symmetric, in the present embodiment, the controller 200 can be made to know how the read operation should be performed for the calculation of soft bits SB. By providing this information for the controller 200 in advance, part or all of the first sequence described with reference to FIG. 9 can be set in the NAND flash memory 100. As a result, by issuing the second sequence only once, soft bits SB1 through SB4 and hard bit HB can be calculated as described with reference to FIG. 13 through FIG. 16, and can be held in the latch circuits designated in advance.

The present embodiment was described, referring to the case where the soft bits of a lower page are obtained. Needless to say, the same technique is applicable to the cases of an upper page, a higher page and a top page. This holds true for each of the embodiments described below.

2. Second Embodiment

Next, a semiconductor memory device according to the second embodiment will be described. The first embodiment was described, referring to the case where soft bits SB1 through SB4 and hard bit HB are calculated simultaneously.

In the present embodiment, however, only one of soft bits SB is calculated. In the following, a description will be given only of the points differentiating the second embodiment from the first embodiment.

2.1 Data Read Operation

The general flow of the read operation according to the second embodiment is similar to that of the first embodiment described with reference to FIG. 6. The second embodiment differs from the first embodiment in that only one of soft bits SB is read in steps S129 and S154 shown in FIG. 6.

Figure 17:
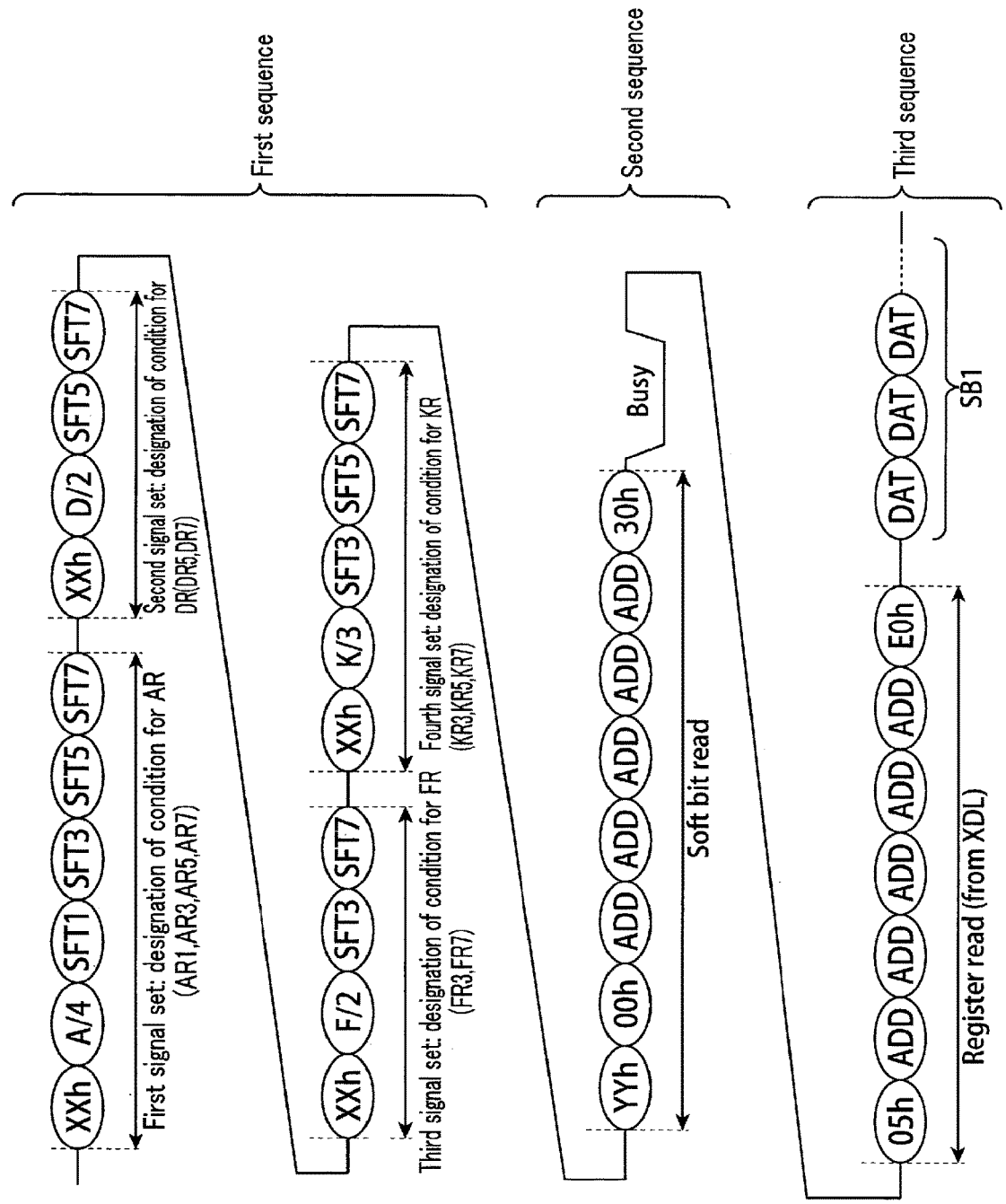
FIG. 17 illustrates command sequences used when a soft bit read is performed according to the second embodiment.

FIG. 17 illustrates command sequences that are transmitted and received between the controller 200 and the NAND flash memory in steps S129 and S154, and the command sequences correspond to those illustrated in FIG. 9 and FIG. 10 and explained in connection with the first embodiment. FIG. 17 illustrates an example in which soft bit SB1 is read.

As illustrated, in the second embodiment, first through third sequences are transmitted from the controller 200 to the NAND flash memory 100, as in the first embodiment. The second embodiment differs from the first embodiment in that only the conditions regarding soft bit SB1 are set in the NAND flash memory 100, no latch circuit is designated then, and only the data regarding soft bit SB1 is read in the NAND flash memory 100. In read operations AR, DR, FR and KR, soft bit SB1 is calculated, using data that are read under the following conditions:

AR: −3Δ, −Δ, +Δ, +3Δ, the number of read times=four times
DR: +Δ, +3Δ, the number of read times=twice
FR: −Δ, +3Δ, the number of read times=twice
KR: −Δ, +Δ, +3Δ, the number of read times=three times Since no latch circuit is designated, the data read from a memory cell is stored in latch circuit XDL.

As shown in FIG. 17, therefore, the first sequence sets the above-mentioned conditions in the NAND flash memory 100.

Then, the second sequence is issued. The prefix command "YYh" of the second sequence is to instruct generation of soft bit SB1 with respect to the lower page. Upon reception of the second sequence, the NAND flash memory 100 becomes busy, and data is read from a memory cell.

Figure 18:
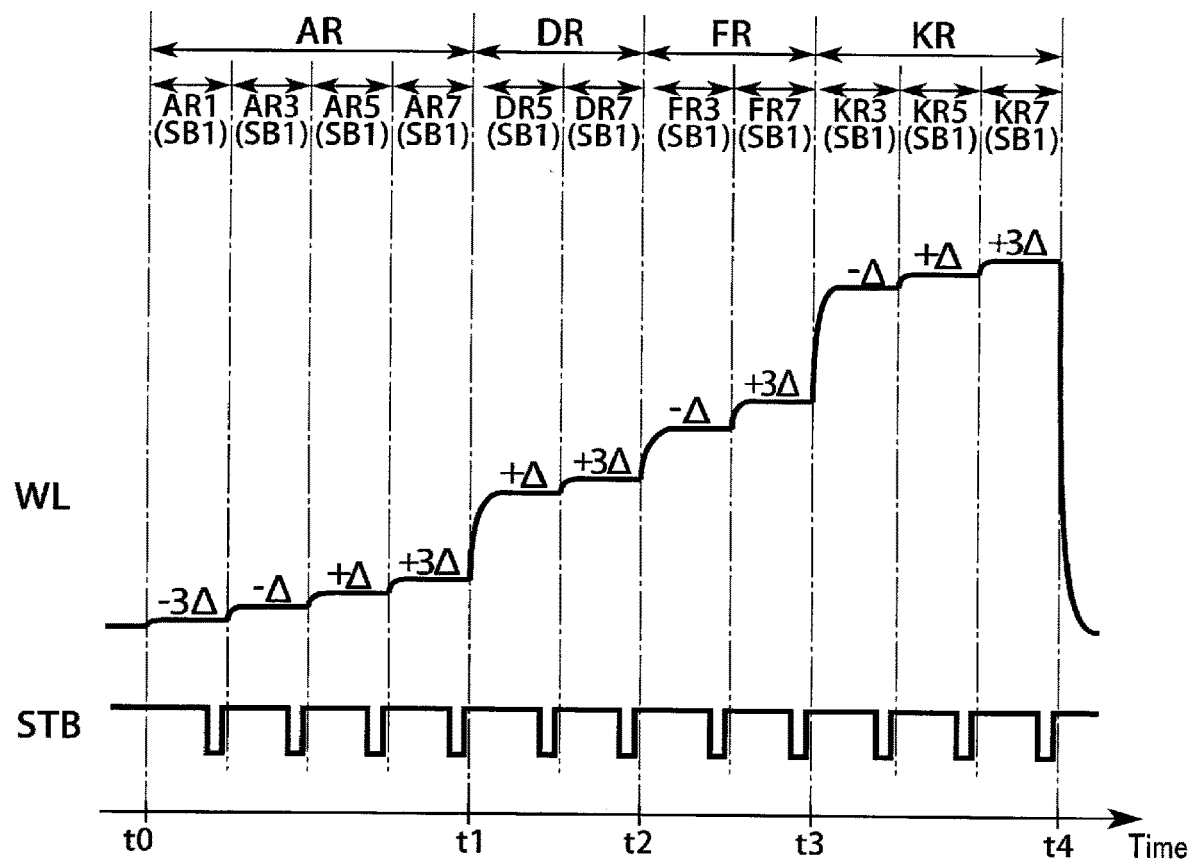
FIG. 18 is a timing chart showing how a word line voltage changes with time when a soft bit read is performed according to the second embodiment.

FIG. 18 is a timing chart showing how the voltage applied to a selected word line and strobe signal STB supplied to the column control circuit 140 are when the NAND flash memory 100 performs a read operation.

As shown in FIG. 18, in the second embodiment, read operation AR is performed in the period from time t0 through time t1. The voltage applied to selected word line WL is sequentially stepped up from the voltage which is 3Δ, lower than voltage VA' to the voltage which is 3Δ higher than VA', and in this state data is read (AR1, AR3, AR5 and AR7). The data held in latch circuit XDL during the execution of read operations AR1, AR3, AR5 and AR7 is similar to that held in latch circuit ADL shown in FIG. 13 and explained in connection with the first embodiment.

Subsequently, read operation DR is performed in the period from time t1 through time t2. The voltage applied to selected word line WL is sequentially stepped up from the voltage which is Δ higher than voltage VD' to the voltage which is 3Δ higher than VD', and in this state data is read (DR5 and DR7). The data held in latch circuit XDL during the execution of read operations DR5 and DR7 is similar to that held in latch circuit ADL shown in FIG. 14 and explained in connection with the first embodiment.

Furthermore, read operation FR is performed in the period from time t2 through time t3. The voltage applied to selected word line WL is sequentially stepped up from the voltage which is Δ lower than voltage VF' to the voltage which is 3Δ higher than VF', and in this state data is read (FR3 and FR7). The data held in latch circuit XDL during the execution of read operations FR3 and FR7 is similar to that held in latch circuit ADL shown in FIG. 15 and explained in connection with the first embodiment.

Read operation KR is performed in the period from time t3 through time t4. The voltage applied to selected word line WL is sequentially stepped up from the voltage which is Δ lower than voltage VK' to the voltage which is Δ higher than voltage VK', and then to the voltage 3Δ higher than VK', and in this state data is read (KR3, KR5 and KR7). The data held in latch circuit XDL during the execution of read operations KR3, KR5, and KR7 is similar to that held in latch circuit ADL shown in FIG. 16 and explained in connection with the first embodiment.

As a result of the above operations, soft bit SB1 is held in latch circuit XDL. In the period from t0 through t4, the other latch circuits ADL, BDL, CDL and DDL are not used.

Then, the third sequence is issued. In the third sequence, the controller 200 issues a normal register read command, as shown in FIG. 17. As a result, soft bit SB1 held in latch circuit XDL is transferred to the controller 200.

2.2 Advantages of Second Embodiment

According to the second embodiment, only necessary data is selected, and only the conditions for obtaining the data are set. Accordingly, the reading and operations regarding unnecessary data can be omitted, and efficient and high-speed data reading is thus enabled.

The second embodiment was described, referring to the case where soft bit SB1 is read. Needless to say, the second embodiment is applicable to the case where hard bit HB or one of the other soft bits SB2 through SB4 is read.

3. Third Embodiment

Next, a semiconductor memory device according to the third embodiment will be described. The third embodiment differs from the first embodiment in that the operation method for generating soft bits SB is different and in that the latch circuit to be used is set in the NAND flash memory 100 in advance. In the following, a description will be given only of the points differentiating the third embodiment from the first embodiment.

3.1 Data Read Operation

The general flow of the read operation according to the third embodiment is similar to that of the first embodiment described with reference to FIG. 6. The third embodiment differs from the first embodiment in terms of the conditions which the first sequence sets in step S129 shown in FIG. 6.

Figure 19:
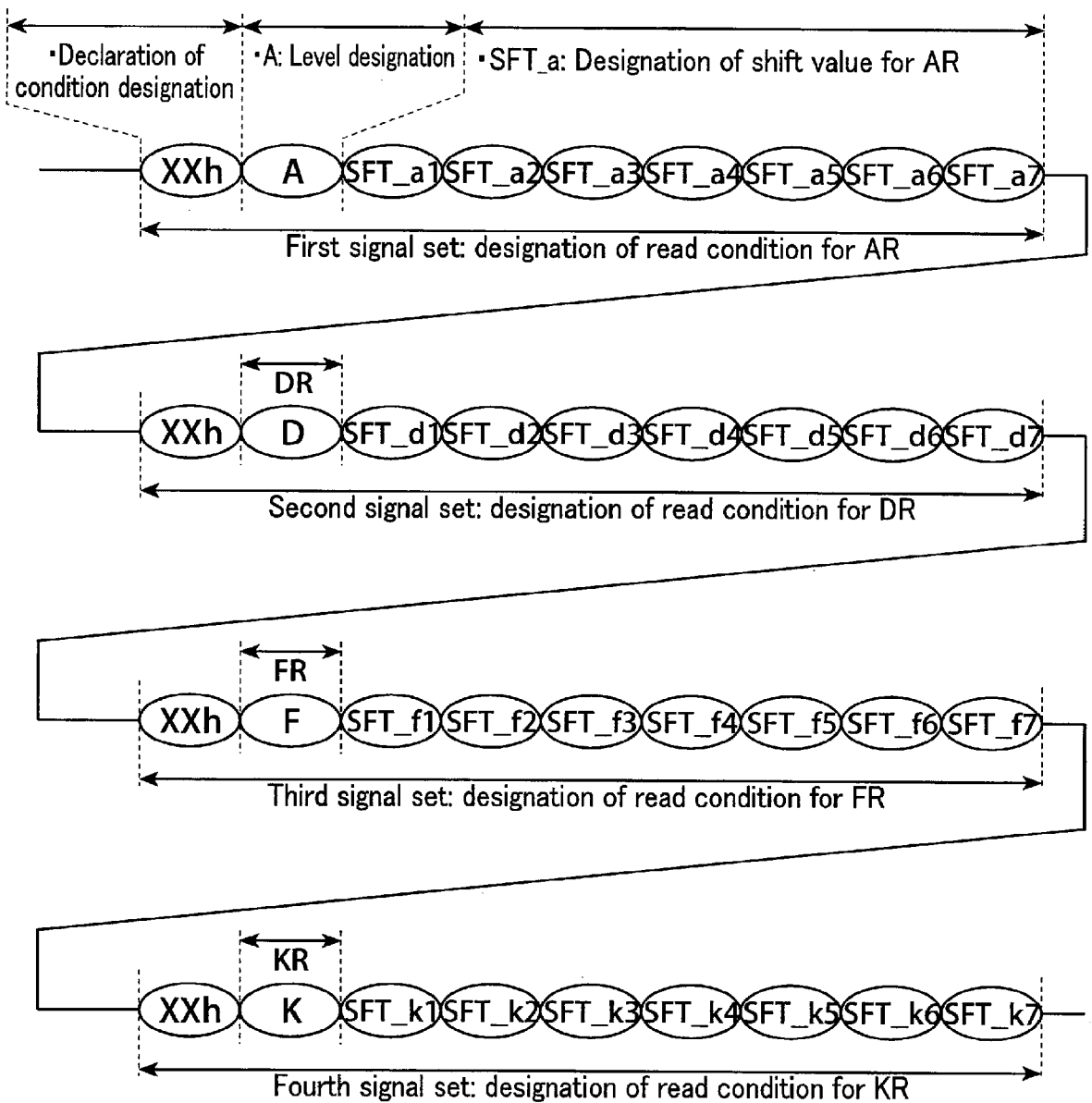

FIG. 19 shows command sequences which are included in the first sequence of step S129 and which correspond to those shown in FIG. 9 and described in connection with the first embodiment. FIG. 19 illustrates a case where soft bit SB1 is read. As mentioned above, according to the third embodiment, the NAND flash memory 100 takes a positive role in calculating soft bit SB. For example, the sequencer 160 of the NAND flash memory 100 retains information on the relationships between how soft bits SB and read data, namely such relationships as described with reference to FIG. 8 (the necessary number of times a soft bit read operation has to be performed and operation methods required to obtain each soft bit). Also, it is determined in advance that in the soft bit calculation, latch circuit XDL is used for calculating hard bit HB and latch circuits ADL, BDL, CDL and DDL are used for calculating soft bits SB1 through SB4. Therefore, the controller 200 is only required to set a read level and a read voltage shift amount in the NAND flash memory 100.

In the case of the first signal set shown in FIG. 19, command "XXh" is transmitted in the first cycle, as in FIG. 9 explained in connection with the first embodiment. The command "XXh" of the third embodiment is only required to declare that conditions are to be designated, and specific operations need not be designated.

In the second cycle, a read level is designated, as in the first embodiment. At this time, however, it is not necessary to designate the number of read times.

In the third through ninth cycles, a shift amount is designated, but the designation of latch circuits is not necessary. In the present embodiment and in the fourth through sixth embodiments described later, a shift amount will be indicated, for example, as "SFT_a1." In this notation, the suffix "a" indicates that the shift amount is that for read operation AR, and the number "1" indicates that the shift amount is that for the first cycle (a shift amount is input over a plurality of cycles). Although the notation "SFT1 through SFT7" used in connection with the first and second embodiments represents absolute values of voltage shift amounts, the notation "SFT_a1" used in the third through sixth embodiments is just a variable.

After shift amounts SFTa_a1 through SFT_a7 are designated for read operation AR, as above, shift amounts SFT_d1 through SFT_d7 for read operation DR, shift amounts SFT_f1 through SFT_f7 for read operation FR, and shift amounts SFT_k1 through SFT_k7 for read operation KR are designated in subsequent second through fourth signal sets.

The operations performed thereafter are similar to those of the second and subsequent sequences of the first embodiment. That is, the sequences shown in FIG. 10 are issued, and the operations described with reference to FIG. 12 through FIG. 16 are executed.

3.2 Advantages of Third Embodiment

According to the third embodiment, information on the soft bits SB is held in the NAND flash memory 100, and the number of conditions which the controller 200 sets in the NAND flash memory for each read operation can be reduced. Accordingly, the load on the controller 200 can be reduced.

In the second sequence shown in FIG. 10, command "01h" may be issued between command "YYh" and command "00h." Command "01h" denotes a lower page. Therefore, when an upper page, a higher page and a top page are read, commands "02h", "03h" and "04h" are issued in place of command "01h." This holds true for the fourth and subsequent embodiments described below.

4. Fourth Embodiment

Next, a semiconductor memory device according to the fourth embodiment will be described. The fourth embodiment differs from the second embodiment in that the operation method for generating soft bits SB is different and in that the latch circuit to be used is set in the NAN flash memory 100 in advance. In other words, the fourth embodiment is an embodiment obtained by applying the above-mentioned third embodiment to the second embodiment. In the following, a description will be given only of the points differentiating the fourth embodiment from the third embodiment.

4.1 Data Read Operation

The general flow of the read operation according to the fourth embodiment is similar to that of the first embodiment described with reference to FIG. 6. The fourth embodiment differs from the first embodiment in terms of the conditions the first sequence sets in step S129 shown in FIG. 6.

FIG. 20 shows command sequences which are included in the first sequence of step S129 and correspond to those shown in FIG. 19 and described in connection with the third embodiment. FIG. 20 illustrates a case where soft bit SB1 is read, as in FIG. 19.

In the case of the first signal set shown in FIG. 20, command "XXh" is transmitted in the first cycle. Like the command "XXh" of the third embodiment, the command "XXh" of the fourth embodiment does not have to designate what operations are to be executed. In the second cycle, a read level and the number of read times are designated, as in the first embodiment. In the third through sixth cycles, a shift amount is designated, but the designation of latch circuits is not necessary.

The signals of the above six cycles form first through fourth signal sets. In the second signal set, the number of read times is twice, and the designation of a shift amount is required only twice. Therefore, the signals of the remaining two cycles are ignored by the NAND flash memory 100. This holds true for the third signal set and fourth signal set as well.

In connection with the fourth embodiment, reference was made to the case where the number of cycles of each signal set is six. This is just an example, and the number of cycles of each signal set may be five cycles or seven cycles. Desirably, the number of cycles should be determined such that all necessary shift amounts can be designated by one signal set. Of read operations AR, DR, FR and KR performed in the fourth embodiment, read operation AR requires the largest number of read times, and that number of read times is four times. Therefore, four cycles are needed for the shift amount designation, and as a result of this one signal set includes six cycles. If the maximum number of read times required is five times, each signal set should preferably include seven cycles.

The operations performed thereafter are similar to those of the second and subsequent sequences of the second embodiment. That is, the second and third sequences described with reference to FIG. 17 are issued. The voltage described with reference to FIG. 18 is applied to selected word line WL, and operations similar to those of the second embodiment are executed.

4.2 Advantages of Fourth Embodiment

According to the fourth embodiment, the same advantage as described in relation to the second embodiment and the third embodiment are achieved.

5. Fifth Embodiment

Next, a semiconductor memory device according to the fifth embodiment will be described. In the fifth embodiment, the controller 200 sets various conditions in the NAND flash memory 100, as in the first embodiment, but the setting can be performed with a higher degree of freedom. In the following, a description will be given only of the points differentiating the fifth embodiment from the first embodiment.

5.1. Condition Designation Unit Set

According to the fifth embodiment, command "XXh" is issued and read conditions are set, each time data is read from a memory cell. This command sequence will be hereinafter referred to as a condition designation unit set. For example, when read operations AR1 through AR7 are executed, seven condition designation unit sets are issued, and these correspond to the first signal set explained in connection with the first embodiment.

Figure 21:
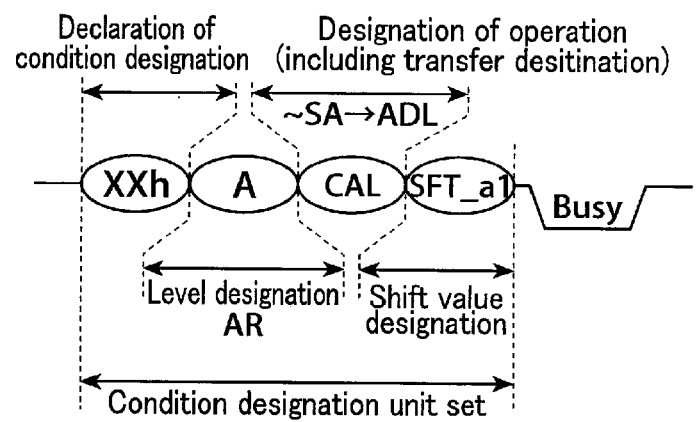

FIG. 21 illustrates a sequence of the condition designation unit set. As shown in FIG. 21, the condition designation unit set is a signal set which the controller 200 provides in four cycles. The first cycle is command "XXh", and this command declares the setting of read conditions, as in the third and fourth embodiments. The second cycle signal designates a read level, as in the first embodiment. The third cycle signal "CAL" designates which operation is to be performed and also designates a transfer destination to which an operation result is to be transferred. In the example shown in FIG. 21, the inversion of the data read by the sense amplifier SA and the storage of the inverted data in latch circuit ADL are designated. The last (four) cycle signal designates a shift amount.

When the condition designation unit set mentioned above is transmitted from the controller 200 to the NAND flash memory 100, information is set in the register group 150, the sequencer 160 and the column control circuit 140, and the NAND flash memory 100 becomes busy.

The first sequence according to the fifth embodiment will be described with reference to FIG. 22 through FIG. 25. FIG. 22 through FIG. 25 illustrate the first sequence, and the command sequences shown in FIG. 22 through FIG. 25 are sequentially transferred from the controller 200 to the NAND flash memory 100.

First, the condition designation unit set described with reference to FIG. 21 is issued seven times, as shown in FIG. 22. These condition designation unit sets designate read conditions of read operations AR1 through AR7. The seven condition designation unit sets correspond to the first signal set shown in FIG. 9 and explained in connection with the first embodiment.

Figure 24:
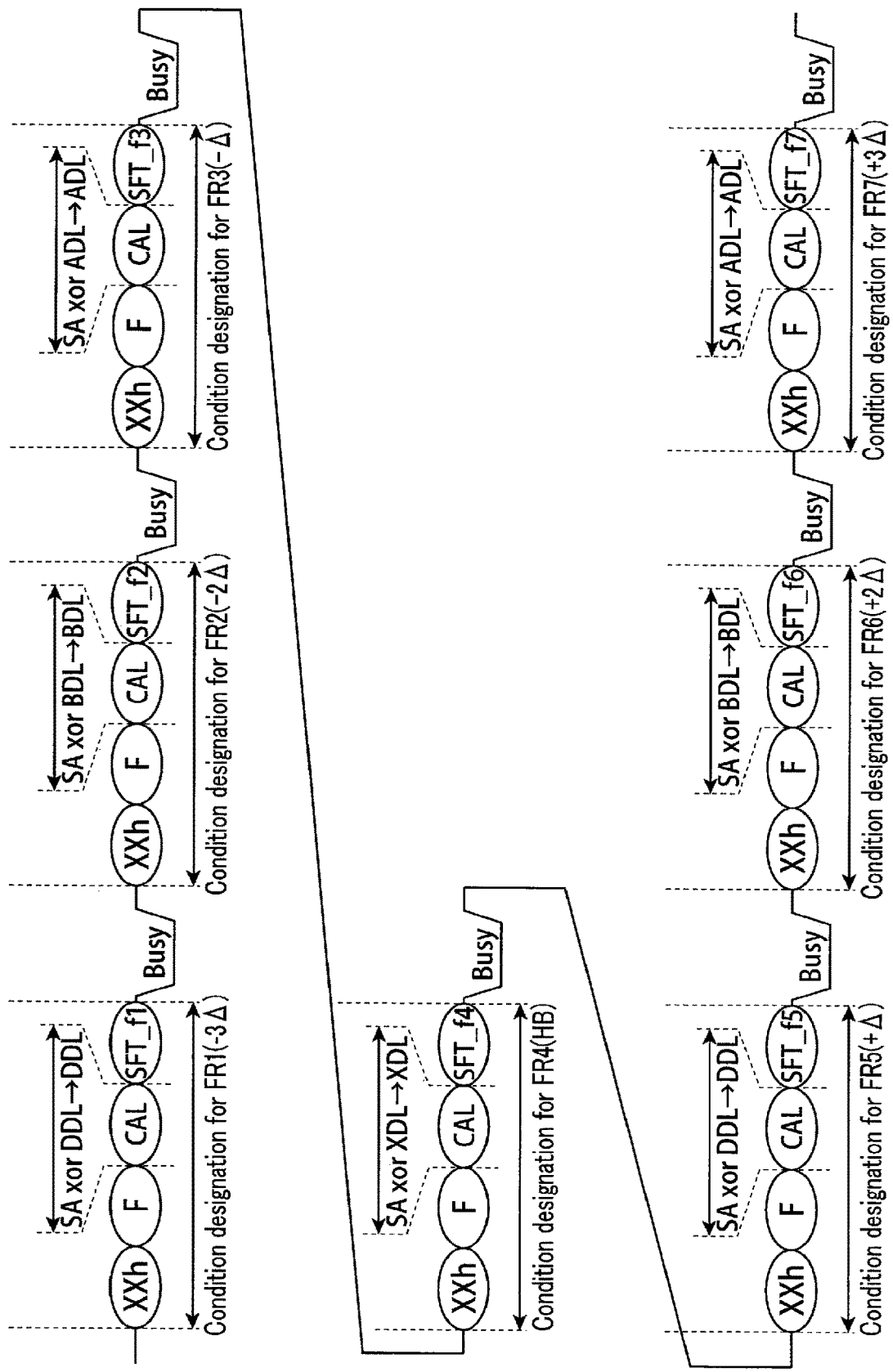
Figure 25:
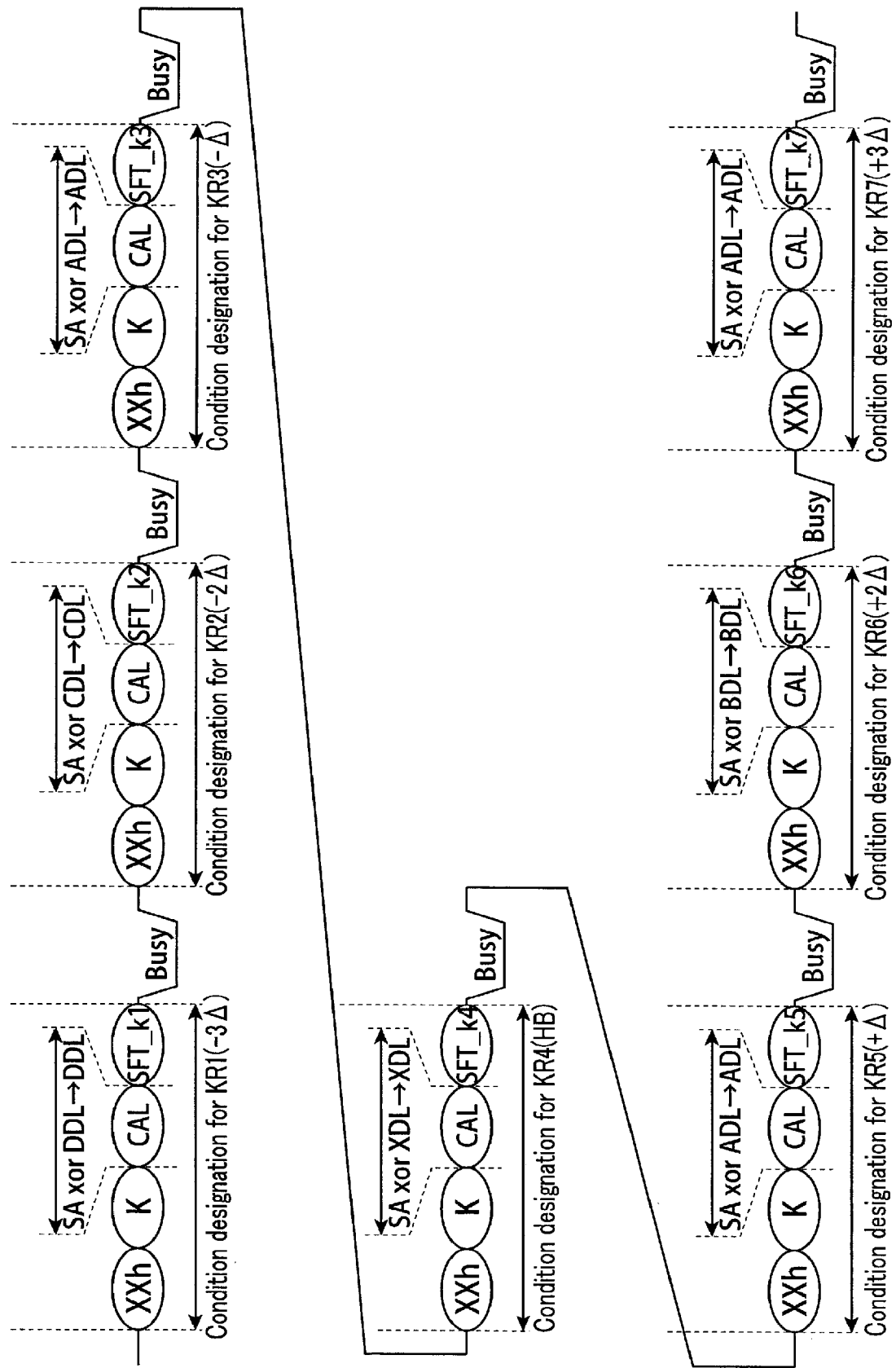

Then, a condition designation unit set is issued seven times again, as shown in FIG. 23. These condition designation unit sets designate read conditions of read operations DR1 through DR7. The seven condition designation unit sets correspond to the second signal set shown in FIG. 9. Thereafter, a condition designation unit set is issued seven times again to designate read conditions of read operations FR1 through FR7, as shown in FIG. 24, and a condition designation unit set is issued seven times again to designate read conditions of read operations KR1 through KR7, as shown in FIG. 25.

As described above, the controller 200 sets the conditions of read operations AR1 through AR7, DR1 through DR7, FR1 through FR7 and KR1 through KR7 by issuing a condition designation unit set 28 (=7×4) times.

The operations performed thereafter are similar to those of the second and subsequent sequences described in connection with the first embodiment. That is, the sequences shown in FIG. 10 are issued, and the operations described with reference to FIG. 12 through FIG. 16 are executed.

5.2 Advantages of Fifth Embodiment

According to the fifth embodiment, the controller 200 can set read conditions not for the soft bit read performed at a given read level but for each of the read operations included in the soft bit read. Accordingly, the controller 200 can control the read operations of the NAND flash memory 100 with a high degree of freedom.

6. Sixth Embodiment

Next, a semiconductor memory device according to the sixth embodiment will be described. The sixth embodiment is an embodiment in which the second embodiment is realized using the condition designation unit sets described in connection with the fifth embodiment. In the following, a description will be given only of the points differentiating the sixth embodiment from the second embodiment.

6.1 Data Read Operation

Figure 26:
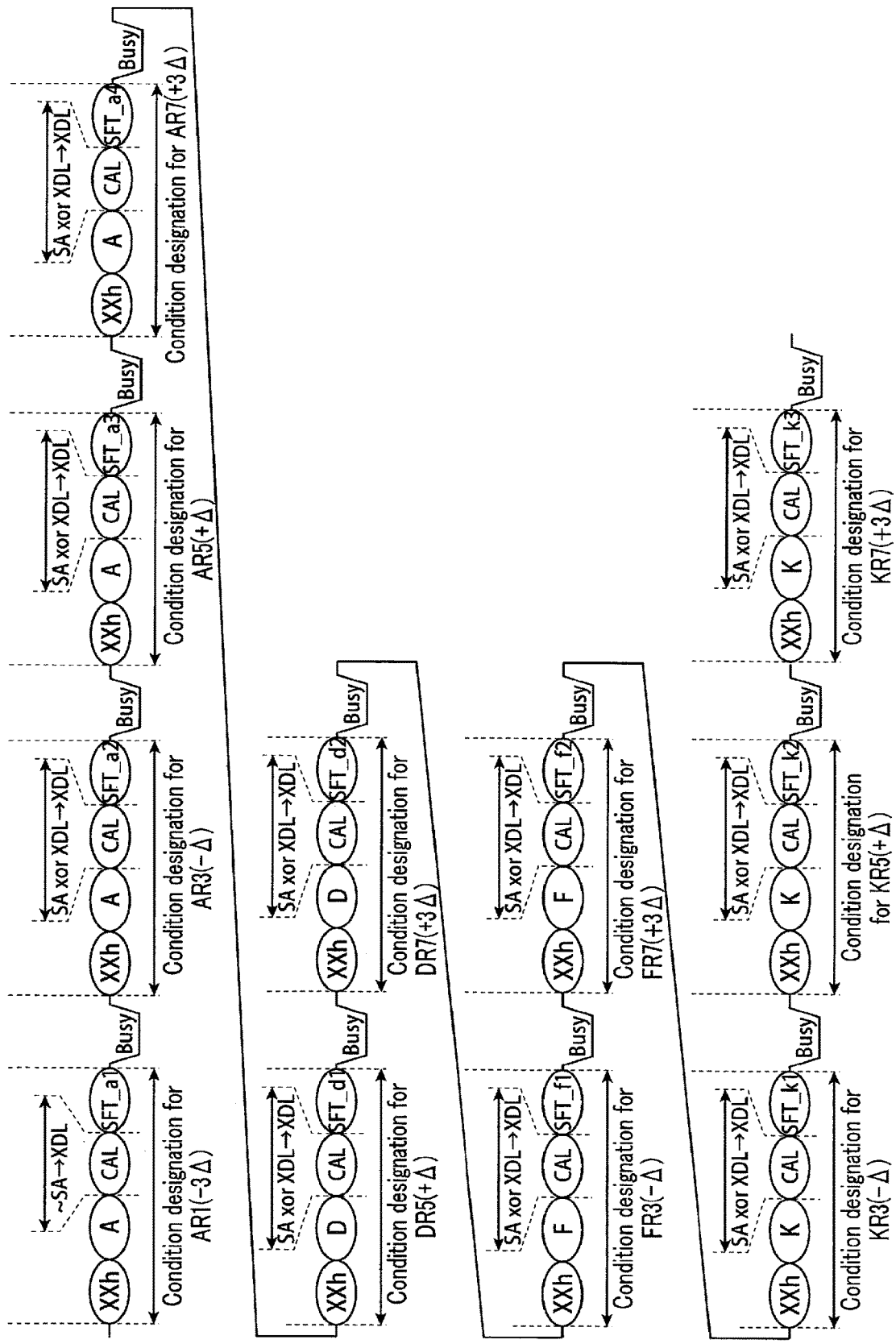
FIG. 26 illustrates command sequences used when a soft bit read is performed according to the sixth embodiment.

The sixth embodiment differs from the second embodiment in that the first sequence shown in FIG. 17 is replaced with the sequence shown in FIG. 26.

In the example shown in FIG. 17, the read conditions of four read operations AR1, AR3, AR5 and AR7 are collectively transmitted as the first signal set. Also, the read conditions of two read operations DR5 and DR7 are collectively transmitted as the second signal set. In addition, the read conditions of two read operations FR3 and FR7 are collectively transmitted as the third signal set. Further, the read conditions of three read operations KR3, KR5 and KR7 are collectively transmitted as the third signal set.

In contrast, according to the sixth embodiment, a condition designation unit set is issued each time eleven read operations required for obtaining soft bit SB1 are performed, as shown in FIG. 26. The eleven condition designation unit sets are configured to set read conditions of read operations AR1, AR3, AR5, AR7, DR5, DR7, FR3, FR7, KR3, KR5 and KR7, respectively.

The operations performed thereafter are similar to those of the second and subsequent sequences of the second embodiment. That is, the second and third sequences described with reference to FIG. 17 are issued. The voltages described with reference to FIG. 18 are applied to selected word line WL, and operations similar to those of the second embodiment are executed.

6.2 Advantages of Sixth Embodiment

According to the sixth embodiment, the same advantage as described in relation to the second embodiment and the fifth embodiment are attained.

7. Modifications, etc.

As described above, the semiconductor memory device according to each of the above-mentioned embodiments includes a first memory cell capable of storing data, and a first latch circuit (ADL) and a second latch circuit (BDL) associated with the first memory cell. When a first address for designating either the first latch circuit or the second latch circuit (latch designation in FIG. 9) and a read command for reading the data stored in the first memory cell are externally received, the data is read from the first memory cell, and the read data is held in the first latch circuit or second latch circuit corresponding to the first address (FIG. 13).

When first operation information for designating an operation (operation designation XXh in FIG. 9) and a read command for reading the data in the first memory cell (tracking read in FIG. 10) are externally received, the data is read from the first memory cell, an operation based on the first operation information is executed for the read data, and an operation result is stored in the first latch circuit (FIG. 13).

Furthermore, when first number-of-times information (the number-of-times information in FIG. 9) representing the number of read times, first voltage information (SFT1-SFT7 in FIG. 9) regarding read voltages, and read commands (tracking read in FIG. 10) for reading the data stored in the first memory cell are externally received, the data reading from the first memory cell is repeated by the number of times (AR1-AR7 in FIG. 13) based on the first number-of-times information, and a read voltage is varied (−3Δ through +3Δ in FIG. 13) based on the first voltage information each time the data reading is repeated.

According to the configurations, the controller 200 can set various read conditions in the NAND flash memory 100 before data is read from a memory cell. Examples of the read conditions include designation of the latch circuit to be used for storing the read data, a read level, an operation to be performed for the read data, the number of read times, and a voltage shift amount. Owing to this, even when a complicated soft bit is calculated, the data required for this calculation can be collected in the same latch circuits, and the necessary operation can be executed. The soft bit can be obtained easily and at high speed. Accordingly, the semiconductor memory device, the controller, and the memory system including these can have improved performance.

The embodiments described above are just examples and can be modified in various ways. The above embodiments were described, referring to the case where each memory cell holds 4-bit data and soft bit SB is obtained in the manner shown in FIG. 8. However, each memory cell may hold data of 3 bits or less or data of 5 bits or more, and the relationships between the soft bit and read data are not limited to those shown in FIG. 8.

Although the above embodiments were described, referring to the case where the soft bits are obtained, the technology may be applied to the tracking read described in connection with step S152 shown in FIG. 6. As described above, in step S152, the number of ON cells is counted, with the read voltage being shifted, and the voltage that makes the voltage difference minimal is regarded as the intersection between threshold distributions. An XNOR operation may be used for the calculation of the voltage difference. That is, in step S152, for example, one latch circuit XDL is designated, the designated operation is that first read data is inverted and subsequently read data and the data stored in latch circuit XDL until then are subjected to an XNOR operation, and the number of read times and a shift amount are designated. Latch circuit XDL, which corresponds to an OFF cell, continues to hold "0" data, and when the memory cell is turned on at a given voltage, the data held in latch circuit XDL is inverted as "1" data. The NAND flash memory 100 transmits only the bits whose values are inverted from "0" to "1." Alternatively, the NAND flash memory 100 may count the number of bits whose values are inverted from 0" to "1" and transmit the result to the controller 200. According to this method, the NAND flash memory 100 does not have to transmit 1-page data to the controller 200 each time a read operation is performed, and the controller 200 does not have to calculate the difference. Accordingly, the load on the controller 200 can be alleviated, and a high-speed operation is achieved.

The above embodiments were described, referring to the case where read operations are sequentially performed at different read levels, as shown in FIG. 12 and FIG. 18. That is, read operations AR, DR, FR and KR are sequentially performed, and the voltage applied to selected word line WL keeps increasing until the end of read operation KR.

Figure 28:
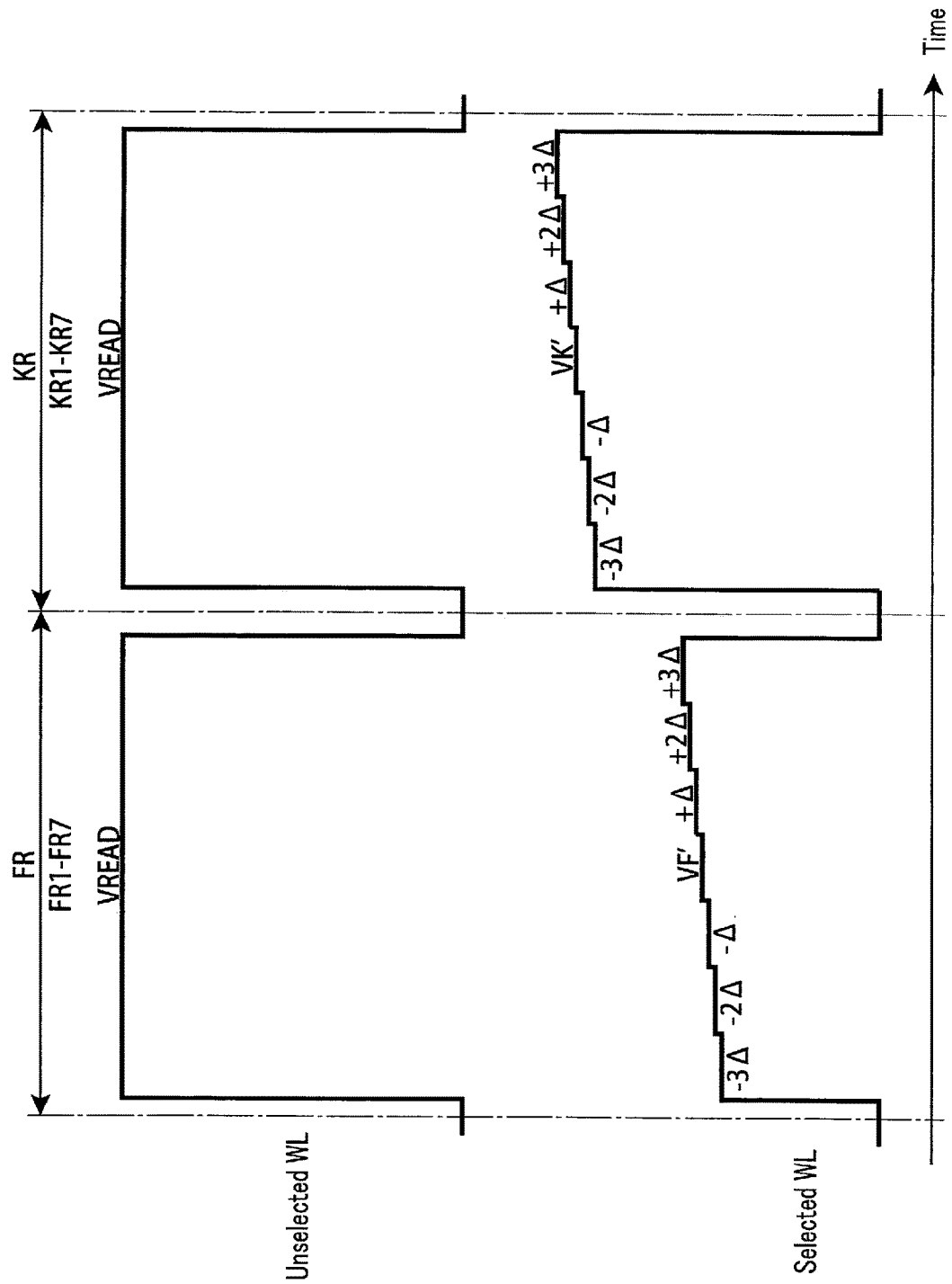
Figure 30:
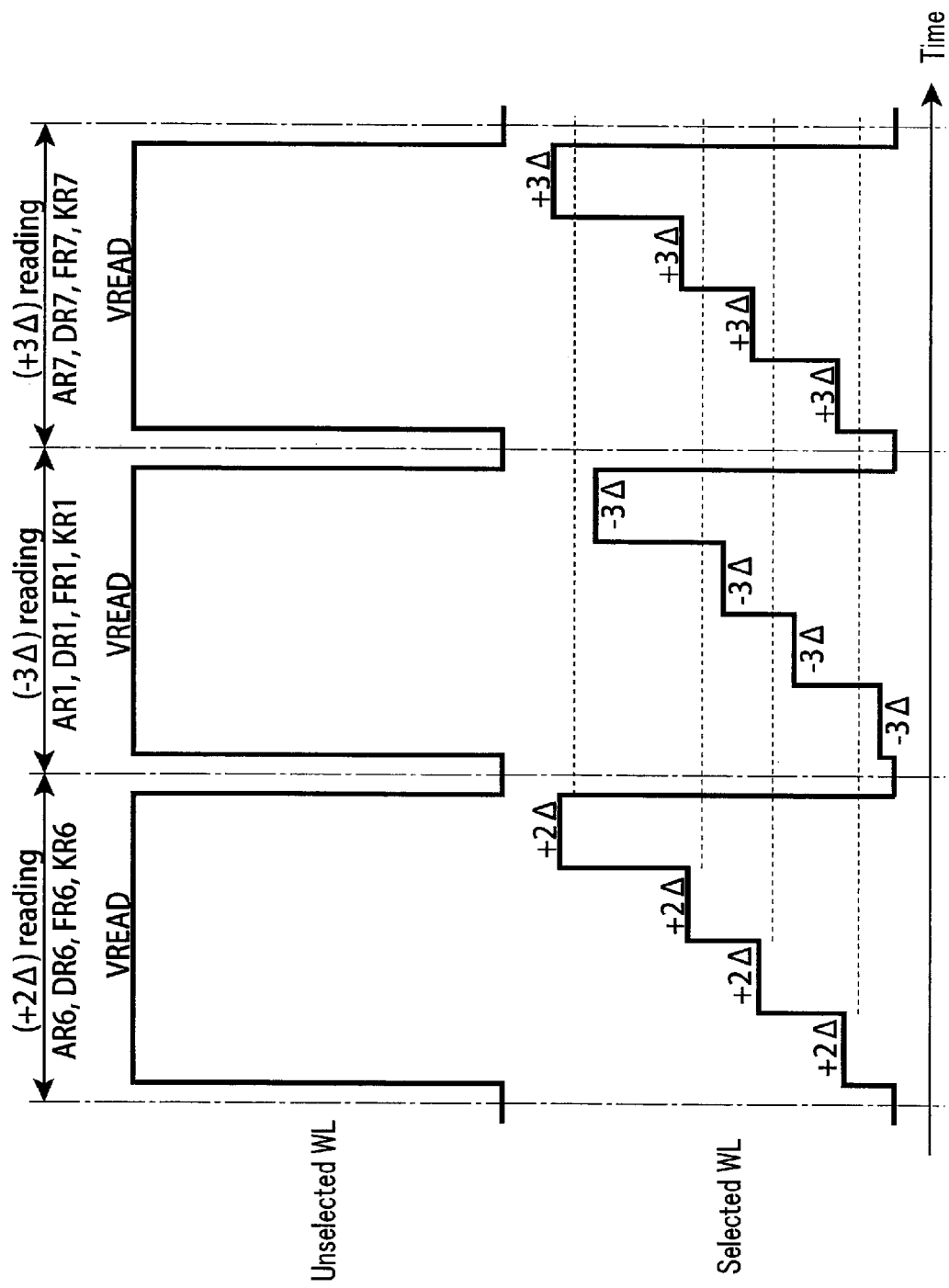

However, the voltage applied to word line WL may be reset (for example, to 0V) between the read operations performed at different read levels. An example of such a case is shown in FIG. 27 and FIG. 28. In this example, voltage VREAD applied to unselected word lines is reset likewise. In this case, the second sequence described with reference to FIG. 10 may be issued when each of read operations AR, DR, FR and KR is executed. It should be noted that the first sequence is issued before the execution of all read operations. The read operations may be a normal shift read. An example of this case is shown in FIG. 29 and FIG. 30. As shown, a hard bit read (corresponding to AR4, DR4, FR4 and KR4 described in relation to the first embodiment) is first executed with respect to a lower page. Next, data is read, with the voltage applied to selected word line WL being shifted by $-\Delta$ (the data read corresponds to AR3, DR3, FR3 and KR3 described in relation to the first embodiment).

Subsequently, data is read, with the voltage applied to selected word line WL being shifted by $+\Delta$. In the subsequent read operations, the voltage applied to selected word line WL is shifted by $-2\Delta$, $+2\Delta$, $-3\Delta$ and $+3\Delta$ in this order.

The order in which the voltage is shifted is not limited to the above example, and the voltage may be shifted in various orders. For example: the voltage may be shifted in the following orders:

$HB \rightarrow (-2\Delta) \rightarrow (+2\Delta) \rightarrow (-3\Delta) \rightarrow (+3\Delta) \rightarrow (-\Delta) \rightarrow (+\Delta)$ $(-3\Delta) \rightarrow (-2\Delta) \rightarrow (-\Delta) \rightarrow HB \rightarrow (+\Delta) \rightarrow (+2\Delta) \rightarrow (+3\Delta)$ The symbol "HS" denotes a hard bit read.

Figure 31:
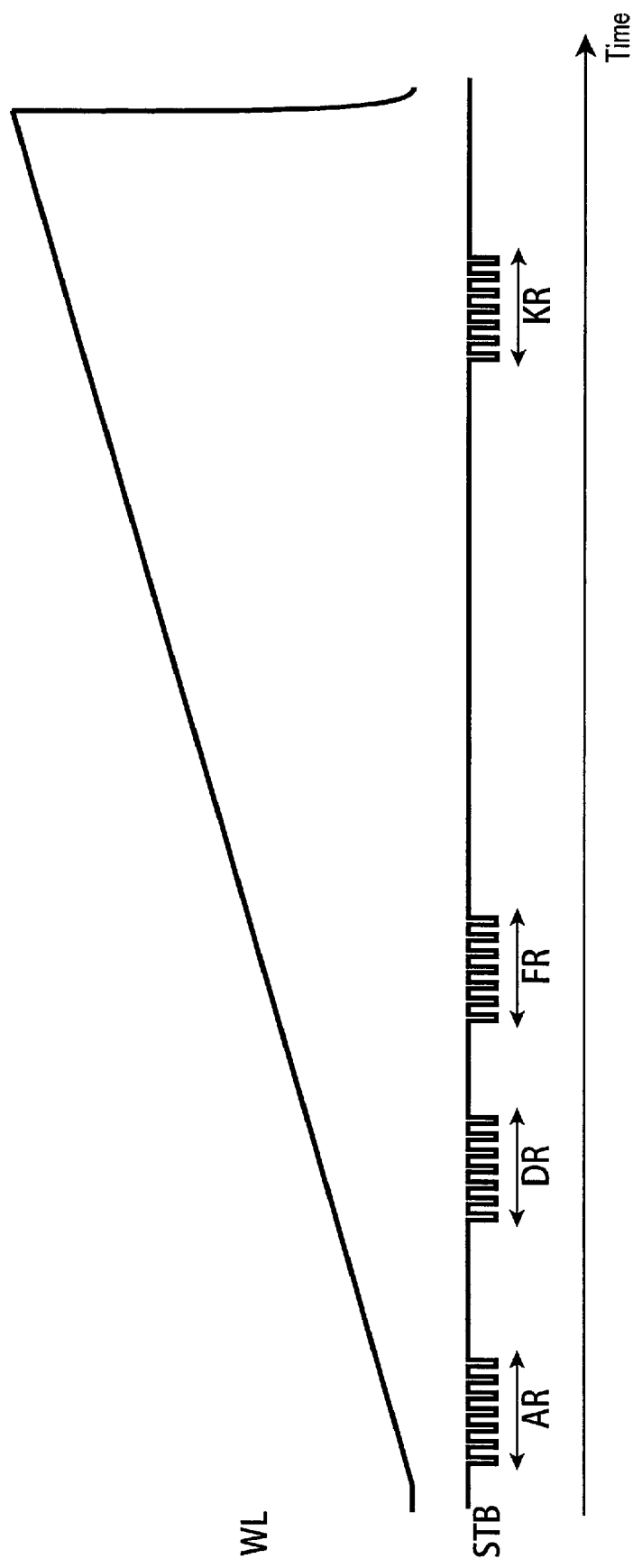
FIG. 31 is a timing chart showing how a word line voltage changes with time when a soft bit read is performed according to the third modification of each of the first through sixth embodiments.

The voltage applied to a selected word line may be continuously increased with time. This example is shown in FIG. 31. As shown, the voltage applied to the word line is increased not stepwise but continuously. When the voltage value reaches a proper value, signal STB is asserted, and data is finally determined by the sense amplifier SA. The expression "being continuously increased with time" is intended to cover the case where the voltage is stepped up very slightly, and an example of this is the case where the voltage is stepped up twice when signal STB is being asserted.

The unit shift amount $\Delta$ may differ for each read voltage. The conditions that can be set by the controller 200 are not limited to those described in connection with the above embodiments but may be properly selected. Needless to say, one of the conditions described in connection with the embodiments may be set, and only the conditions necessary for the controller 200 may be freely set in the NAND flash memory 100.

Note that in each embodiment concerning the present invention, (1) When the memory cell holds 2-bit data ("Er", "A", "B", and "C"), the voltage applied to the selected word line in the read operation of "A" level may range from, for example, 0 V to 0.55 V. However, the present invention is not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the read operation of "B" level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the read operation of "C" level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the read operation may be set within the range of, for example, 25 µs to 38 µs, 38 µs to 70 µs, or 70 µs to 80 µs.

(2) A writing operation may include a program operation and a verify operation. In the writing operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write accessing an odd numbered word line and the voltage first applied to the selected word line when write accessing an even numbered word line may be different.

If the program operation may be ISPP (Incremental Step Pulse Program), the voltage of step up may be, for example, 0.5 V.

The voltage applied to an unselected word line may be set within the range of, for example, 6.0 V to 7.3 V. However, the voltage is not limited to this and may be set within the range of, for example, 7.3 V to 8.4 V or set to 6.0 V or less.

The pass voltage to be applied may be changed depending on whether the unselected word line is an odd numbered word line or an even numbered word line.

A time (tProg) of the writing operation may be set within the range of, for example, 1,700 μs to 1,800 μs, 1,800 μs to 1,900 μs, or 1,900 μs to 2000 μs.

(3) In erasing operation,

The voltage first applied to the well which may be formed in the upper portion of the semiconductor substrate and above which the memory cell may be arranged may be set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erasing operation may be set within the range of, for example, 3,000 μs to 4,000 μs, 4,000 μs to 5,000 μs, or 4,000 μs to 9,000 μs.

(4) The structure of the memory cell

A charge accumulation layer may be arranged on a 4 to 10 nm thick tunnel insulating film on the semiconductor substrate (silicon substrate). The charge accumulation layer may have a stacked structure of a 2 to 3 nm thick insulating film of SiN or SiON and 3 to 8 nm thick polysilicon. A metal such as Ru may be added to the polysilicon. An insulating film is provided on the charge accumulation layer. The insulating film may include a 4 to 10 nm thick silicon oxide film sandwiched between a 3 to 1 nm thick lower High-k film and a 3 to 10 nm thick upper High-k film. As the High-k film, HfO or the like may be usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell configured to store first data;
   a first latch circuit associated with the first memory cell; and
   a second latch circuit associated with the first memory cell,
   wherein when the semiconductor memory device receives, from an external device, a first address designating one of the first latch circuit and the second latch circuit and a read command for reading the first data of the first memory cell,
   bit data based on the first data is read from the first memory cell and the read bit data is held in the one of the first latch circuit and the second latch circuit designated by the first address.

2. The semiconductor memory device according to claim 1, further comprising
   a first register configured to store the received first address, wherein
   the bit data read from the first memory cell is held in a latch circuit designated by the first address held in the first register.

3. The semiconductor memory device according to claim 1, wherein an operation is executed based on first bit data read from the first memory cell and second bit data previously read from the first memory cell and held in a latch circuit designated by the first address, and the second bit data held in the latch circuit designated by the first address is updated to a result of the operation.

4. The semiconductor memory device according to claim 3, wherein the operation to be executed is designated before the bit data is read from the first memory cell.

5. The semiconductor memory device according to claim 3, wherein
   the semiconductor memory device receives, from the external device, first operation information which specifies the operation to be executed, and
   the operation is executed in accordance with the first operation information.

6. The semiconductor memory device according to claim 5, wherein the semiconductor memory device sequentially receives a first command sequence including both the first address and first operation information and a second command sequence including the read command, and
   a latch circuit to be used for holding the bit data and the operation to be executed are determined in accordance with information designated by the first command sequence.

7. The semiconductor memory device according to claim 5, wherein the semiconductor memory device receives, from the external device, number-of-times information representing a number of read times,
   the semiconductor memory device sequentially receives a first command sequence including the first address, the first operation information and the number-of-times information and a second command sequence including the read command, and
   a latch circuit to be used for holding the bit data, the operation to be executed and a number of read times are determined in accordance with information designated by the first command sequence.

8. The semiconductor memory device according to claim 5, wherein the semiconductor memory device receives a first signal set a plurality of times, the first signal set including the first address, the first operation information and first voltage information regarding a read voltage,
   a read operation to read the bit data from the first memory cell is repeated by the same number of times the first signal set is received, and
   in the read operation repeatedly performed, a latch circuit to be used for holding the bit data, the operation to be executed and the read voltage are determined in accordance with information designated by a corresponding first signal set.

9. The semiconductor memory device according to claim 8, wherein the first memory cell is capable of storing multi-bit data in accordance with a threshold voltage thereof,
   a first bit of the multi-bit data is determined at least based on a first read operation using, as a read level, a voltage between a first threshold value range and a second threshold value range, and a second read operation using, as a read level, a voltage between a third threshold value range and a fourth threshold value range,
   the semiconductor memory device receives the first signal set a number of times with respect to the first read operation, and receives the first signal set a number of times with respect to the second read operation, and
   the first address designates the first latch circuit as a storage in which the bit data repeatedly read in the first read operation is held, and further designates the second latch circuit as a storage in which the bit data repeatedly read in the second read operation is held to generate first soft bit data in the first latch circuit and second soft bit data in the second latch circuit, which are to be used for a soft decision operation.

10. The semiconductor memory device according to claim 1, wherein the semiconductor memory device receives, from the external device, number-of-times information representing a number of read times, and
    the bit data is repeatedly read from the first memory cell N times, N corresponding to a number represented by the first number-of-times information, after the read command is received.

11. The semiconductor memory device according to claim 10, wherein the semiconductor memory device further receives, from the external device, first voltage information regarding a read voltage, and
    the read voltage is varied in accordance with the first voltage information each of the N times the bit data is read from the first memory cell.

12. The semiconductor memory device according to claim 10, wherein the first data stored in the memory cell is multi-bit in accordance with a threshold voltage thereof,
    a first bit of the multi-bit is determined at least based on a first read operation using, as a read level, a voltage between a first threshold value range and a second threshold value range, and a second read operation using, as a read level, a voltage between a third threshold value range and a fourth threshold value range,
    the semiconductor memory device receives the first address and the number-of-times information in regards to the first read operation and the second read operation, and executes each of the first read operation and the second read operation when the read command is received, and
    the first address designates the first latch circuit as a storage in which the bit data repeatedly read by the first read operation is held, and further designates the second latch circuit as a storage in which the bit data repeatedly read by the second read operation is held to generate first soft bit data in the first latch circuit and second soft bit data in the second latch circuit, which are to be used for a soft decision operation.

13. The semiconductor memory device according to claim 1, wherein the semiconductor memory device further receives, from the external device, first voltage information regarding a read voltage,
    the bit data is repeatedly read from the first memory cell a number of times, after the read command is received, and
    the read voltage is varied in accordance with the first voltage information each of the number of times the bit data is read from the first memory cell.

14. The semiconductor memory device according to claim 1, wherein the semiconductor memory device sequentially receives a first command sequence including the first address and a second command sequence including the read command, and
    a latch circuit to be used for holding the bit data is determined in accordance with information designated by the first command sequence.

15. A semiconductor memory device comprising:
    a first memory cell configured to store first data; and
    a first latch circuit associated with the first memory cell,
    wherein when first operation information for designating an operation and a read command for reading the first data in the first memory cell are received from an external device,
    bit data based on the first data is read from the first memory cell, an operation based on the first operation information is executed for the read bit data, and a result of the operation is held in the first latch circuit.

16. The semiconductor memory device according to claim 15, further comprising a first register configured to store the received first operation information,
    wherein the bit data read from the first memory cell is used by the operation designated by the first operation information stored in the first register.

17. The semiconductor memory device according to claim 15, wherein the bit data read from the first memory cell is used for generation of soft bit data for a soft decision operation.

18. A semiconductor memory device comprising:
    a first memory cell configured to store first data,
    wherein when number-of-times information representing a number of read times, first voltage information regarding a read voltage, and a read command for reading the first data in the first memory cell are received from an external device,
    reading of bit data based on the first data from the first memory cell is repeated based on the number-of-times information, and
    the read voltage is varied based on the first voltage information each time the reading of the bit data is repeated.

19. The semiconductor memory device according to claim 18, further comprising a first latch circuit associated with the first memory cell,
    wherein in the repeated reading of the bit data, first bit data is read from the first memory cell using a first read voltage, and second bit data is read from the first memory cell using a second read voltage different from the first read voltage after the first bit data is read,
    when the first bit data is read from the first memory cell, an operation result based on the first bit data is held in the first latch circuit,
    when the second bit data is read from the first memory cell, the operation result in the first latch circuit is updated with an operation result based on both of the second bit data and the operation result based on the first bit data.

20. The semiconductor memory device according to claim 18, wherein the bit data read from the first memory cell is used for generation of soft bit data for a soft decision operation.

* * * * *